(12) United States Patent
Juengling

(10) Patent No.: US 8,810,310 B2
(45) Date of Patent: Aug. 19, 2014

(54) VERTICALLY STACKED FIN TRANSISTORS AND METHODS OF FABRICATING AND OPERATING THE SAME

(71) Applicant: Micron Technology, Inc., Boise, ID (US)

(72) Inventor: Werner Juengling, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/657,487

(22) Filed: Oct. 22, 2012

(65) Prior Publication Data

US 2013/0043531 A1 Feb. 21, 2013

Related U.S. Application Data

(63) Continuation of application No. 12/950,761, filed on Nov. 19, 2010, now Pat. No. 8,294,511.

(51) Int. Cl.
*H01L 25/00* (2006.01)

(52) U.S. Cl.
USPC .......................................................... 327/566

(58) Field of Classification Search
USPC .................................. 327/564, 565, 566, 581
See application file for complete search history.

(56) References Cited

U.S. PATENT DOCUMENTS

| | | | |
|---|---|---|---|
| 3,885,861 A | 5/1975 | Farnsworth et al. | |
| 5,160,987 A | 11/1992 | Pricer et al. | |
| 5,196,910 A | 3/1993 | Moriuchi et al. | |
| 5,661,061 A | 8/1997 | Usuami et al. | |
| 5,821,513 A | 10/1998 | O'Hagan et al. | |
| 5,858,829 A | 1/1999 | Chen | |
| 5,925,918 A | 7/1999 | Wu et al. | |
| 5,949,057 A | 9/1999 | Feng | |
| 6,008,513 A | 12/1999 | Chen | |
| 6,043,562 A | 3/2000 | Keeth | |
| 6,081,008 A | 6/2000 | Rostoker | |
| 6,100,129 A | 8/2000 | Tu et al. | |

(Continued)

FOREIGN PATENT DOCUMENTS

| | | |
|---|---|---|
| DE | 19946719 | 4/2001 |
| JP | 2006054431 | 2/2006 |

(Continued)

OTHER PUBLICATIONS

U.S. Appl. No. 12/033,768, filed Feb. 19, 2008, Werner Juengling.

(Continued)

*Primary Examiner* — Jeffrey Zweizig
(74) *Attorney, Agent, or Firm* — Fletcher Yoder, P.C.

(57) ABSTRACT

A semiconductor device is disclosed having vertically stacked (also referred to as vertically offset) transistors in a semiconductor fin. The semiconductor fin may include lower transistors separated by a first trench and having a source and drain in a first doped region of the fin. The semiconductor fin also includes upper transistors vertically offset from the first transistors and separated by a second trench and having a source and drain in a second doped region of the fin. Upper and lower stacked gates may be disposed on the sidewalls of the fin, such that the lower transistors are activated by biasing the lower gates and upper transistors are activated by biasing the upper gates. Methods of manufacturing and operating the device are also disclosed.

28 Claims, 16 Drawing Sheets

(56) References Cited

U.S. PATENT DOCUMENTS

| | | | |
|---|---|---|---|
| 6,130,551 | A | 10/2000 | Agrawal et al. |
| 6,216,257 | B1 | 4/2001 | Agrawal et al. |
| 6,258,656 | B1 | 7/2001 | Lange et al. |
| 6,258,659 | B1 | 7/2001 | Gruening et al. |
| 6,268,243 | B1 | 7/2001 | Park |
| 6,282,113 | B1 | 8/2001 | DeBrosse |
| 6,316,309 | B1 | 11/2001 | Holmes et al. |
| 6,380,759 | B1 | 4/2002 | Agrawal et al. |
| 6,432,769 | B1 | 8/2002 | Fukuda et al. |
| 6,440,792 | B1 | 8/2002 | Shiao et al. |
| 6,689,660 | B1 | 2/2004 | Noble et al. |
| 6,845,033 | B2 | 1/2005 | Kirihata et al. |
| 6,897,107 | B2 | 5/2005 | Divakaruni et al. |
| 6,927,462 | B2 | 8/2005 | Goodwin et al. |
| 6,967,147 | B1 | 11/2005 | Tews et al. |
| 6,998,666 | B2 | 2/2006 | Beintner et al. |
| 7,091,543 | B2 | 8/2006 | Tzeng et al. |
| 7,098,105 | B2 | 8/2006 | Juengling |
| 7,099,216 | B2 | 8/2006 | Luk et al. |
| 7,132,333 | B2 | 11/2006 | Schloesser et al. |
| 7,151,023 | B1 | 12/2006 | Nayfeh et al. |
| 7,190,060 | B1 | 3/2007 | Chiang |
| 7,195,995 | B2 | 3/2007 | Mouli |
| 7,205,606 | B2 | 4/2007 | Tran |
| 7,345,937 | B2 | 3/2008 | Yoon et al. |
| 7,612,405 | B2 * | 11/2009 | Yu et al. .................. 257/328 |
| 7,742,324 | B2 * | 6/2010 | Juengling .................. 365/149 |
| 7,883,972 | B2 * | 2/2011 | Yoon et al. .................. 438/283 |
| 7,915,659 | B2 * | 3/2011 | Juengling .................. 257/308 |
| 7,969,776 | B2 * | 6/2011 | Juengling .................. 365/174 |
| 8,148,776 | B2 * | 4/2012 | Juengling .................. 257/331 |
| 2001/0003034 | A1 | 6/2001 | Furukawa et al. |
| 2002/0011612 | A1 | 1/2002 | Hieda |
| 2002/0155656 | A1 | 10/2002 | Hayano et al. |
| 2003/0168676 | A1 | 9/2003 | Itabashi et al. |
| 2003/0198073 | A1 | 10/2003 | Keeth |
| 2004/0027848 | A1 | 2/2004 | Wald et al. |
| 2004/0043592 | A1 | 3/2004 | Goodwin et al. |
| 2004/0062069 | A1 | 4/2004 | Keeth |
| 2004/0125636 | A1 | 7/2004 | Kurjanowicz et al. |
| 2004/0202027 | A1 | 10/2004 | Kuzmenka et al. |
| 2005/0133852 | A1 | 6/2005 | Shau |
| 2005/0151206 | A1 | 7/2005 | von Schwerin |
| 2005/0196918 | A1 | 9/2005 | von Schwerin |
| 2005/0245024 | A1 | 11/2005 | von Schwerin |
| 2006/0006446 | A1 | 1/2006 | von Schwerin |
| 2006/0057814 | A1 | 3/2006 | Weis |
| 2006/0073662 | A1 | 4/2006 | Jang et al. |
| 2006/0076602 | A1 | 4/2006 | Harter et al. |
| 2006/0131651 | A1 | 6/2006 | Sato et al. |
| 2006/0244106 | A1 | 11/2006 | Morikado |
| 2006/0246607 | A1 | 11/2006 | Fazan et al. |
| 2006/0270151 | A1 | 11/2006 | Lee |
| 2006/0273415 | A1 | 12/2006 | Kim |
| 2006/0281250 | A1 | 12/2006 | Schloesser |
| 2007/0010058 | A1 | 1/2007 | Juengling |
| 2007/0023805 | A1 | 2/2007 | Wells et al. |
| 2007/0052040 | A1 | 3/2007 | von Schwerin |
| 2007/0111455 | A1 | 5/2007 | Kim et al. |
| 2007/0121414 | A1 | 5/2007 | Butler |
| 2007/0134878 | A1 | 6/2007 | Brask et al. |
| 2007/0145450 | A1 | 6/2007 | Wang et al. |
| 2007/0166933 | A1 | 7/2007 | Song et al. |
| 2007/0170522 | A1 | 7/2007 | Lee et al. |
| 2007/0176221 | A1 | 8/2007 | Nakamura |
| 2007/0176222 | A1 | 8/2007 | Ikemasu et al. |
| 2007/0176253 | A1 | 8/2007 | Wang et al. |
| 2007/0190736 | A1 | 8/2007 | Liu et al. |
| 2007/0262375 | A1 | 11/2007 | Juengling |
| 2008/0157225 | A1 | 7/2008 | Datta et al. |
| 2009/0237996 | A1 | 9/2009 | Kirsch et al. |
| 2009/0251946 | A1 | 10/2009 | Juengling |

FOREIGN PATENT DOCUMENTS

| | | |
|---|---|---|
| KR | 930005234 | 6/1993 |
| KR | 20020018071 | 3/2002 |
| TW | 380316 | 1/2000 |
| TW | 388125 | 4/2000 |
| WO | WO 9728532 | 8/1997 |
| WO | WO 0161738 | 8/2001 |
| WO | WO 0231878 | 4/2002 |
| WO | WO 0249100 | 6/2002 |
| WO | WO 2004/038770 | 5/2004 |
| WO | 2007085996 | 8/2007 |
| WO | 2010030493 | 3/2010 |

OTHER PUBLICATIONS

U.S. Appl. No. 12/033,780, filed Feb. 19, 2008, Werner Juengling.
U.S. Appl. No. 12/033,799, filed Feb. 19, 2008, Werner Juengling.
U.S. Appl. No. 12/043,813, filed Mar. 6, 2008, Werner Juengling.
U.S. Appl. No. 12/052,300, filed Mar. 20, 2008, Werner Juengling.
U.S. Appl. No. 12/052,317, filed Mar. 20, 2008, Werner Juengling.
U.S. Appl. No. 12/052,537, filed Mar. 20, 2008, Werner Juengling.
U.S. Appl. No. 12/062,354, filed Apr. 3, 2008, Werner Juengling.
U.S. Appl. No. 12/130,825, filed May 30, 2008, Werner Juengling.
Betty Prince, Ph.D.; "Trends in Scaled and Nanotechnology Memories"; Memory Strategies International; Leander, Texas; 2005.
Branislav Curanovic; "Development of a Fully-Depleted Thin-Body FinFET Process"; Department of Microelectronic Engineering, College of Engineering; Rochester Institute of Technology; Rochester, New York; Nov. 2003.
Claeys, Cor; "Technological Challenges of Advanced CMOS Processing and Their Impact on Design Aspects"; Proceedings of the 17th International Conference on VLSI Design (VLSID '04); 1063-9667/04; IEEE Computer Society; Leuven, Belgium, 2004.
Enrico Gili; "Fabrication of Vertical MOSFETs With Reduced Parasitics and Suppression of Short Channel Effects"; Department of Electronics and Computer Science, Microelectronics Group; University of Southampton, Jun. 2004 http://66.102.1.104/scholar?hl=en&lr=&q=cache:BErK149qg2MJ:www.ecs.soton.ac.uk/~eg02r/Publications/MinithesisEGili.pdf+dram+fins+%22process+flow%22+%22vertical+access%22.
J. Sturm, et al.; "Increased Transconductance in Fully-Depleted Ultra-Thin Silicon-on-Insulator MOSFETs"; 6 pages.
J-H. Ahn, S-H. Hong, S-J. Kim, J-B. Ko, S-W. Shin, S-D. Lee, Y-W. Kim, K-S. Lee, S-K. Lee, S-E. Jang, J-H. Choi, S-Y. Kim, G-H. Baw, S-W. Park, Y-J. Park, "An Experimental 256Mb Non-Volatile DRAM with Cell Plate Boosted Programming Technique" IEEE International Solid-State Circuits Conference, ISSCC 2004 / Session 2 / Non-Volatile Memory / 2.2, 2004.
R. Katsumata, et al.; "Fin-Array-FET on bulk silicon for sub-100 nm Trench Capacitor DRAM"; 2003 Symposium on VLSI Technology Digest of Technical Papers; Jun. 2003, 2 pages.
T. Park, et al.; "Fabrication of Body-Tied FinFETs (Oega MOSFETs) Using Bulk Si Wafers"; 2003 Symposium on VLSI Technology Digest of Technical Papers; Jun. 2003, 2 pages.
Bor-Wen Chan, Min-Hwa Chi, Liou, Y.H; Notch Elimination in Polycide Gate Stack Etching for Advanced DRAM Technology; Center for Technol. Dev., Worldwide Semicond. Manuf. Corp., Hsinchu; http://ieeexplore.ieee.org/xpl/freeabs_all.jsp?tp=&arnumber=883094&isnumber=19090, 2000.
Chien Yu, Rich Wise, Anthony Domenicucci; A Two-Step Spacer Etch for High-Aspect-Ration Gate Stack Process; IBM Microelectronics; hap://www.mrs.org/s_mrs/s_mrs/sec_subscribe.asp?CID=2353&DID=113693&ation=detail, 2000.
Ikeda, H., Inukai, H.; High-Speed DRAM Architecture Development; NEC Corp., Sagamihara; Solid-State Circuits, IEEE Journal; May 1999; vol. 34, Issue 5, pp. 685-692; http://ieeexplore.ieee.org/xpls/abs_all.jsp?arnumber=760380&isnumber=16453.
Endoh, T., Shinmei, K., Sakuraba, H., Masuoka, F.; New Three-Dimensional Memory Array Architecture for Future Ultrahigh-Density DRAM; Res. Inst. of Electrical Communication, Tohoku University, Sendai; Solid-State Circuites, IEEE Journal; Apr. 1999; vol. 34, Issue 4, pp. 476-483; hottp://ieeexplore.ieee.org/xpls/abs_all.jsp?arnumber=753680.

(56) References Cited

OTHER PUBLICATIONS

Takashima, D., Nakano, H.; A Cell Transistor Scalable DRAM Array Architecture; Memory LSI Res. & Dev. Center, Toshiba Corporation, Yokohama; Solid-State Circuits, IEEE Journal; May 2002; vol. 37, Issue 5, pp. 587-591; http://ieeexplore.ieee.org/xpls/abs_all.jsp?arnumber=997851.

* cited by examiner

VERTICALLY STACKED FIN TRANSISTORS AND METHODS OF FABRICATING AND OPERATING THE SAME

CROSS-REFERENCE TO RELATED APPLICATION

This application is a continuation of U.S. patent application Ser. No. 12/950,761, which was filed on Nov. 19, 2010, now U.S. Pat. No. 8,294,511, which issued on Oct. 23, 2012.

BACKGROUND

1. Field of Invention

Embodiments of the invention relates generally to electronic devices, and more specifically, to non-planar transistors and techniques for fabricating the same.

2. Description of Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Fin field effect transistors (finFETs) are often built around a fin (e.g., a tall, thin, semiconductive member) extending generally perpendicularly from a substrate. Typically, a gate traverses the fin by conformally running up one side of the fin over the top and down the other side of the fin. Generally, a source and a drain are located on opposite sides of the gate in the fin. In operation, a current through the fin between the source and drain is controlled by selectively biasing the gate.

High aspect ratio fins typically are desirable but challenging to construct. Generally, high aspect ratio finFETs can be integrated into a small area of the substrate, thereby potentially reducing manufacturing costs on a per-transistor basis. To increase density of the transistors, the width of each fin, and the gap between each fin, may be reduced. As the dimensions of the fin structures and the space between each fin are reduced, construction of gates or other structures, and operation of the transistors may be increasingly difficult.

DETAILED DESCRIPTION

Some of the subsequently discussed embodiments may facilitate the manufacture of high aspect ratio structures, such as finFETs having vertically offset transistors and stacked and interleaved access lines (e.g., wordlines). As is described in detail below, the vertically offset transistors may be formed at different depths between deep isolation trenches using multiple masking and etching process. Additionally, upper and lower gates may be formed between each fin to form the access lines. The upper transistors may be activated by biasing the upper gates and the lower transistors may be activated by biasing the lower gates. The following discussion describes devices and process flows in accordance with embodiments of the present technique.

Figure 1:
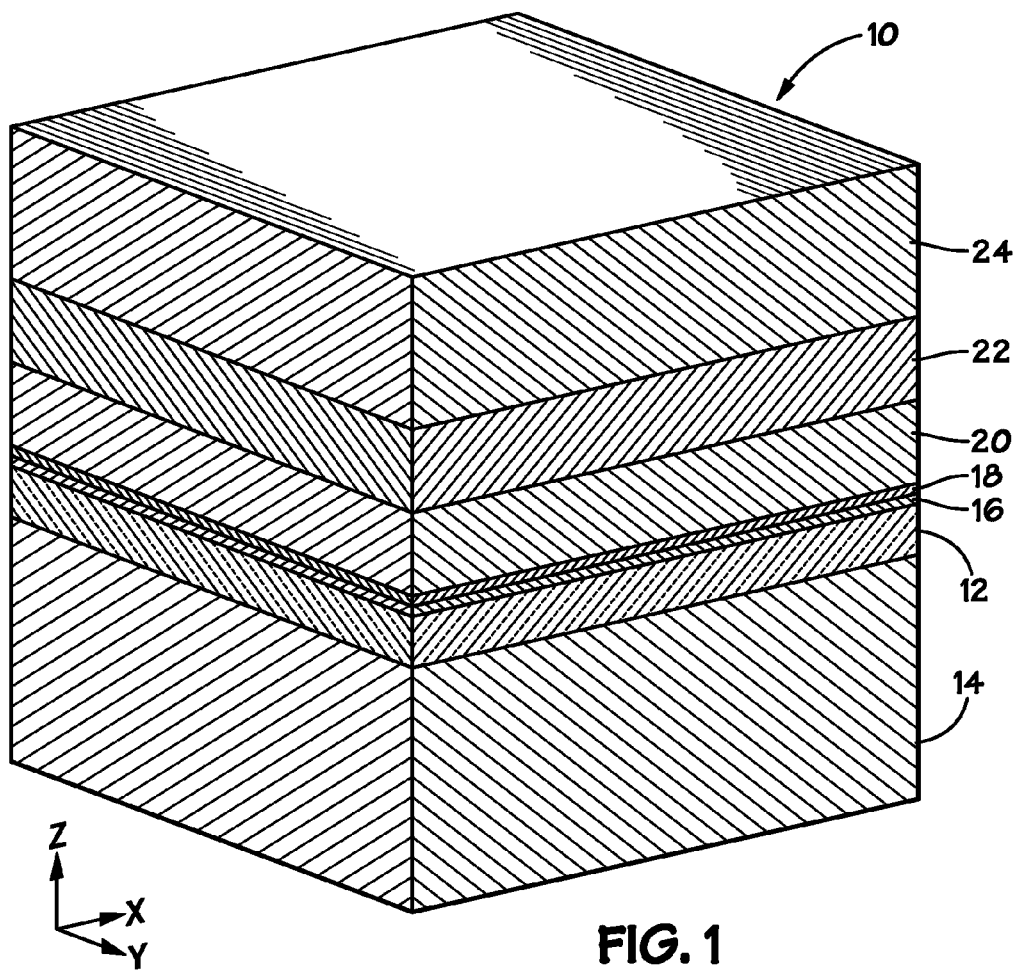
FIGS. 1-8 depict an embodiment of a process for forming deep isolation trenches of a semiconductor device in accordance with an embodiment of the present invention.

FIG. 1 depicts a cross-sectional plane view of a substrate 10 of a portion 11 of a semiconductor device for fabricating high aspect ratio structures, e.g., fins, of a memory array in accordance with an embodiment of the present invention. As used herein, the term "fin" refers to a tall, thin, semiconductor member extending from a substrate and generally having a length (x-direction) greater than the width (y-direction) and greater than the depth (z-direction) of the fin. The substrate 10 may include semiconductive materials such as single crystalline or poly crystalline silicon, gallium arsenide, indium phosphide, or other materials with semiconductor properties. Alternatively, or additionally, the substrate 10 may include a non-semiconductor surface on which an electronic device may be constructed such as a plastic or ceramic work surface, for example. The substrate 10 may be in the form of a whole wafer, a portion of a diced wafer, or a portion of a diced wafer in a packaged electronic device, for instance.

The substrate 10 may include an upper doped region 12 and a lower doped region 14. The depth of the upper doped region 12 may be generally uniform over a substantial area of the substrate 10, and the upper doped region 12 may be doped differently from the lower doped region 14. For example, the upper doped region 12 may include an n+ material and the lower doped region 14 may include a p− material or vise versa.

Next, several materials may be formed on the substrate 10, as illustrated by FIG. 1. A pad oxide 16 may be formed directly on the upper doped region 12. The pad oxide 16 may have a thickness less than 300 Å, e.g., generally about 80 Å. A stop body 18 may be formed on the pad oxide 16. The stop body 18 may include a nitride and it may have a thickness less than about 300 Å, e.g., generally about 95 Å, but like the other structures described herein, the stop body 18 is not limited to these dimensions or materials. A sacrificial body 20 may be formed on the stop body 18. The sacrificial body 20 may be made of polysilicon and it may have a thickness between about 500 Å and about 2,000 Å, e.g., generally about 1000 Å. A lower masking body 22 may be formed on the sacrificial body 20. The lower masking body 22 may be made of an oxide and it may have a thickness between about 500 Å and about 2,000 Å, e.g., generally about 1000 Å. Finally, an upper masking body 24 may be formed on the lower masking body 22. The upper masking body 24 may be made of carbon, and it may have a thickness between about 1000 Å and about 3000 Å, e.g., generally about 2000 Å. These materials 16, 18, 20, 22 and others may be formed with chemical-vapor deposition, spun-on coatings, or other processes know in the art.

Figure 2:
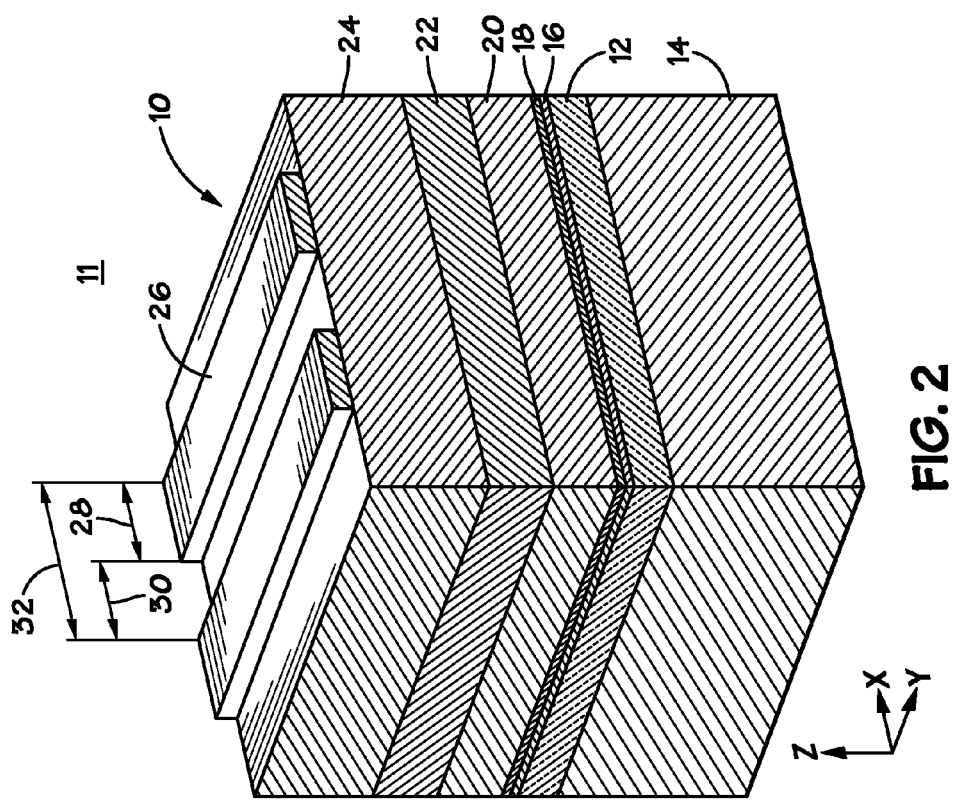

Next, a column mask 26 may be formed, as illustrated by FIG. 2. (The term "column" does not refer to any particular horizontal direction on the substrate 10 other than a direction that is different from the direction that subsequently-introduced rows extend.) The column mask 26 may include a pattern of lines that define masked regions having a width 28 and exposed regions having a width 30. The widths 28 and 30 may be generally equal to each other or generally different widths, and each generally equal to the lithographic-resolution limit (e.g., the photolithographic-resolution limit or minimum achievable feature size), referred to as "F." The column mask 26 may have a pitch 32 that is generally equal to F, 2 F, or other dimensions. The lines formed by the column mask 26 may be generally straight, generally parallel to each other, and may generally extend in the y-direction. These lines may be generally continuous and generally uniform in the y-direction. In other embodiments, though, the lines formed by the column mask 26 may have other shapes, e.g., they may undulate (e.g., up and down, left and right, or both), they may vary in width in the y-direction, or they may be formed from a plurality of shorter segments.

Figure 3:
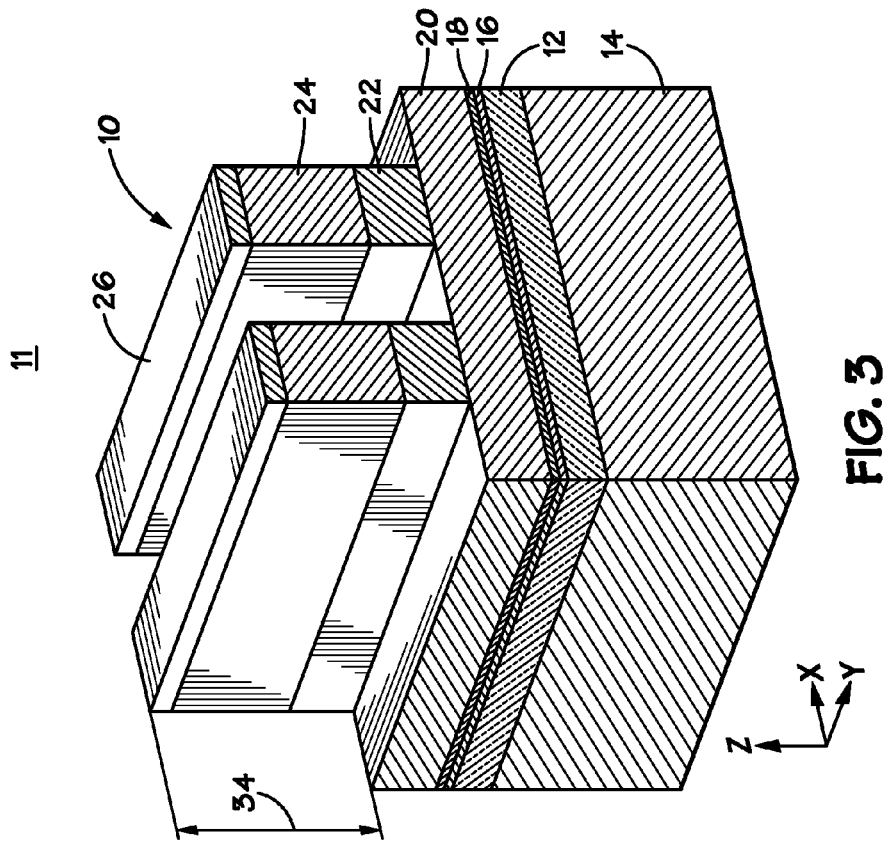

After forming the column mask 26, a column hard mask 34 may be formed, as illustrated by FIG. 3. The column hard mask 34 may be formed by generally-anisotropically etching (e.g., with a directional plasma etch) the portion of the upper masking body 24 and the portion of the lower masking body 22 that are disposed under the region not covered by the column mask 26. In some embodiments, the etch may stop on or in the sacrificial body 20.

Figure 4:
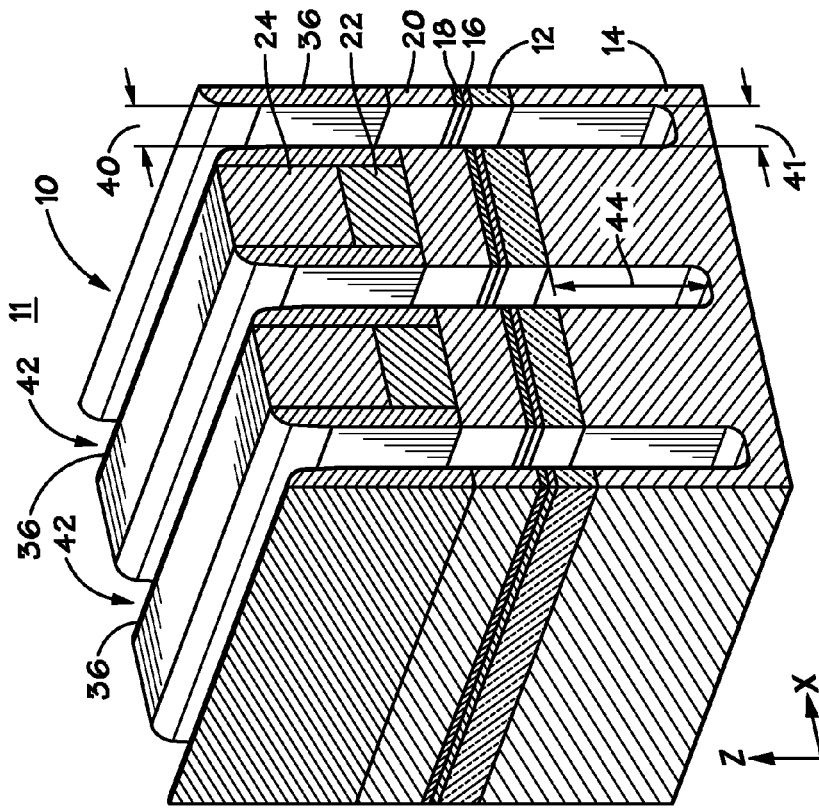

Next, the column mask 26 may be removed, and the column spacers 36 may be formed on the sidewalls of the column hard mask 34, as illustrated by FIG. 4. The column spacers 36 may be formed by depositing a generally conformal film (e.g., a film that is of generally uniform thickness on both vertical and horizontal structures) and, then, anisotropically etching that film to remove it from horizontal surfaces, leaving material disposed against generally vertical surfaces on the substrate 10. The column spacers 36 may be made of an oxide, and they may have a width 38 that is less than about 100 nm. The column spacers 36 may narrow the area exposed by the column hard mask 34 to a width 40 that is less than or equal to F, e.g., generally equal to or less than ¾ F, ½ F, or ¼ F.

Figure 5:
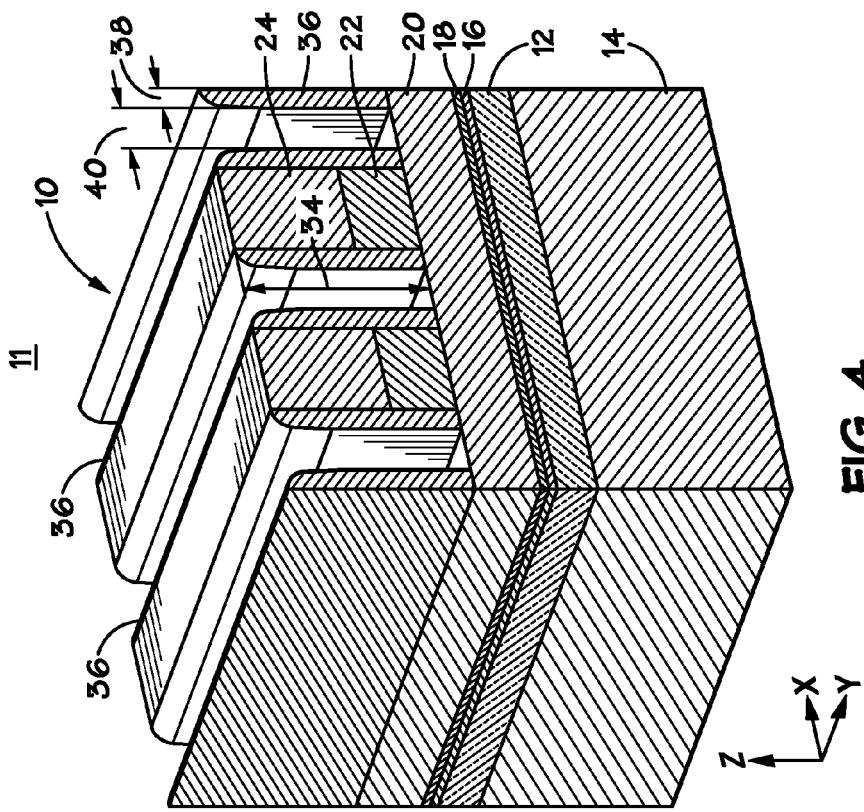

Next, as illustrated by FIG. 5, column isolation trenches 42 (also referred to as deep isolation trenches 42) may be formed. The column isolation trenches 42 may be formed by generally anisotropically etching the exposed regions between the column spacers 36. The column isolation trenches 42 may have a width 41 that corresponds to (e.g., is generally equal to or proportional to) the width 40. The column isolation trenches 42 may generally extend in the y-direction and may be generally parallel to each other and generally straight. The cross-sectional shape of the column isolation trenches 42 may be generally uniform in the y-direction. The column isolation trenches 42 may have a depth 44. Although the formation of the column isolation trenches 42 described above in FIGS. 4 and 5 includes the formation of sidewalls, in other embodiments the column isolation trenches 42 may be patterned and etched using a conventional mask without the formation of sidewalls. For example, in one embodiment, the trenches 42 may be formed through the sacrifical body 20, the stop body 18, the pad oxide 16, the upper doped resion 12, and ending in the lower doped region 14.

Figure 6:
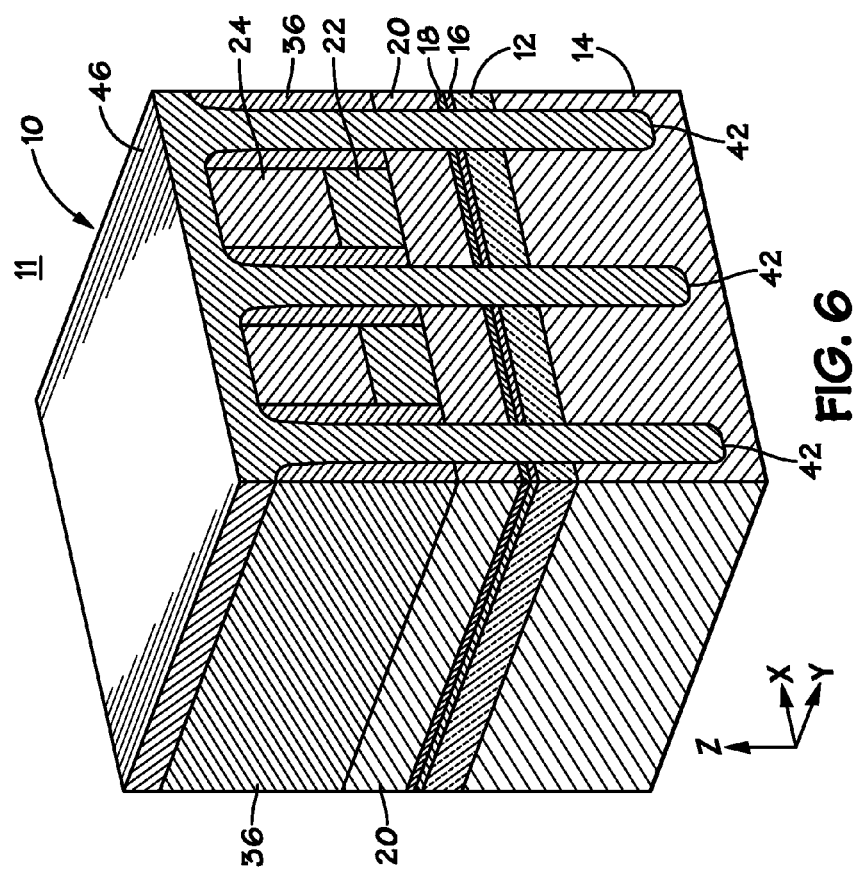

After forming the column isolation trenches 42, they may be filled partially or entirely with a dielectric 46, as illustrated by FIG. 6. The dielectric 46 may be made of a variety of materials, such as an oxide, and it may be lined with a variety of liner films (not shown), such as an oxide liner and a nitride liner. In some embodiments, prior to forming the dielectric 46, the bottom of the column isolation trenches 42 may be implanted or diffused with a dopant selected to further electrically isolate structures on opposing sides of the column isolation trenches 42.

Figure 7:
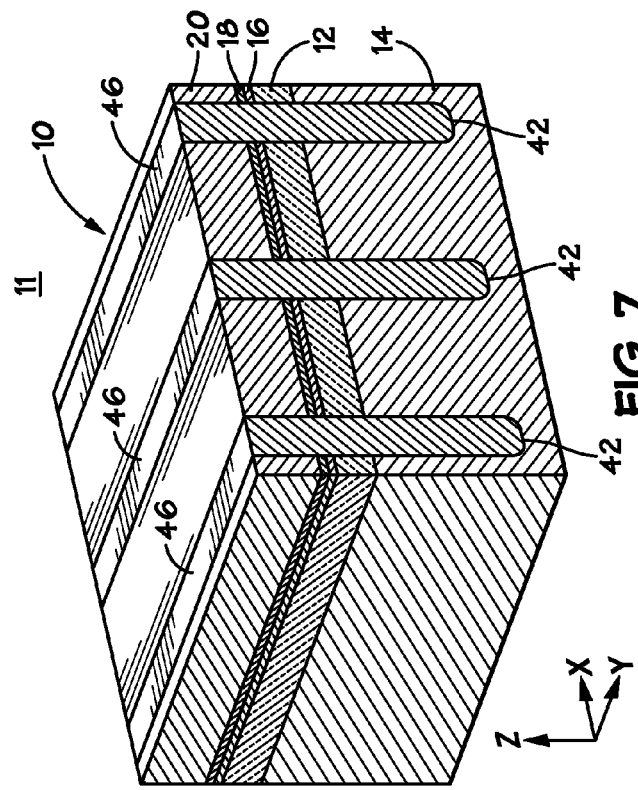

Next, the substrate 10 may be planarized, as illustrated by FIG. 7. Planarizing the substrate 10 may include etching the substrate 10 or polishing the substrate with chemical-mechanical planarization or other methods. Planarization may include removing both the upper masking body 24 and the lower masking body 22, and planarization may stop on or in the sacrificial body 20. Additionally, an upper portion of the dielectric 46 maybe removed.

Figure 8:
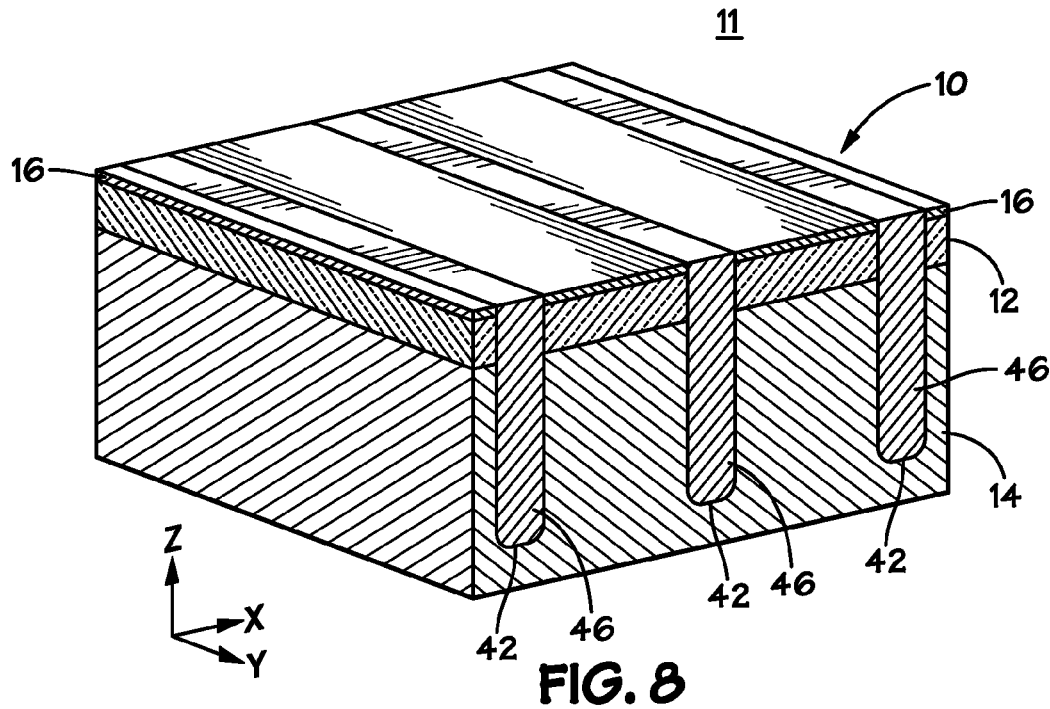

Next, the sacrificial body 20 and dielectric 46 may be partially or entirely removed, as illustrated by FIG. 8. Removing this body 20 and dielectric 46 may include wet etching or dry etching the substrate 10 with an etch that selectively etches the sacrificial body 20 without removing a substantial portion of the exposed dielectric 46, i.e., with an etch that is selective to the sacrificial body 20. An etch is said to be "selective to" a material if the etch removes that material faster than other types of material.

Figure 9:
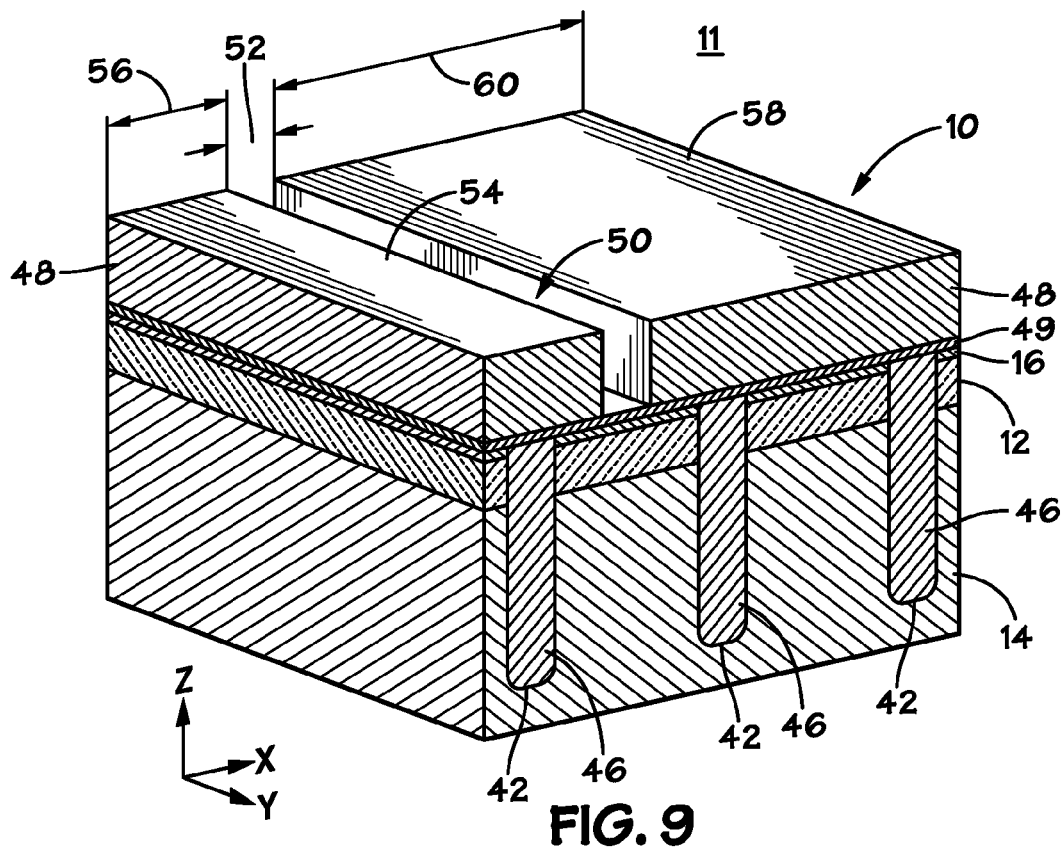
FIGS. 9-11 depict an embodiment of a process for forming first shallow trenches in the device of FIG. 1 in accordance with an embodiment of the present invention.

Next, a first shallow trench mask 48 is formed on the substrate 10, as illustrated by FIG. 9. In some embodiments, another stop body 49 may also be formed on the pad oxide 16. The shallow trench mask 48 may be photoresist or a hard mask, and it may be patterned with various lithographic systems, such as those discussed above. The illustrated shallow trench mask 48 includes exposed regions 50 that may have a width 52 generally equal to or less than ¼ F, ½ F or F, a first covered region 54 with a width 56, and a second covered region 58 with a width 60. The exposed regions 50 may be generally linear, generally parallel, and interposed generally equidistant between every other one of the deep isolation trenches 42. Thus, the exposed region 50, the first covered region 54, and the second covered region 58 may be patterned on the substrate 10 in the x-direction forming exposed regions 50 between every other pair of deep isolation trenches 42. In other embodiments, the first shallow trench mask 48 may be formed with spacers formed on sidewalls of the mask, similar to the techniques described above during formation of the column isolation trenches 42.

Figure 10:
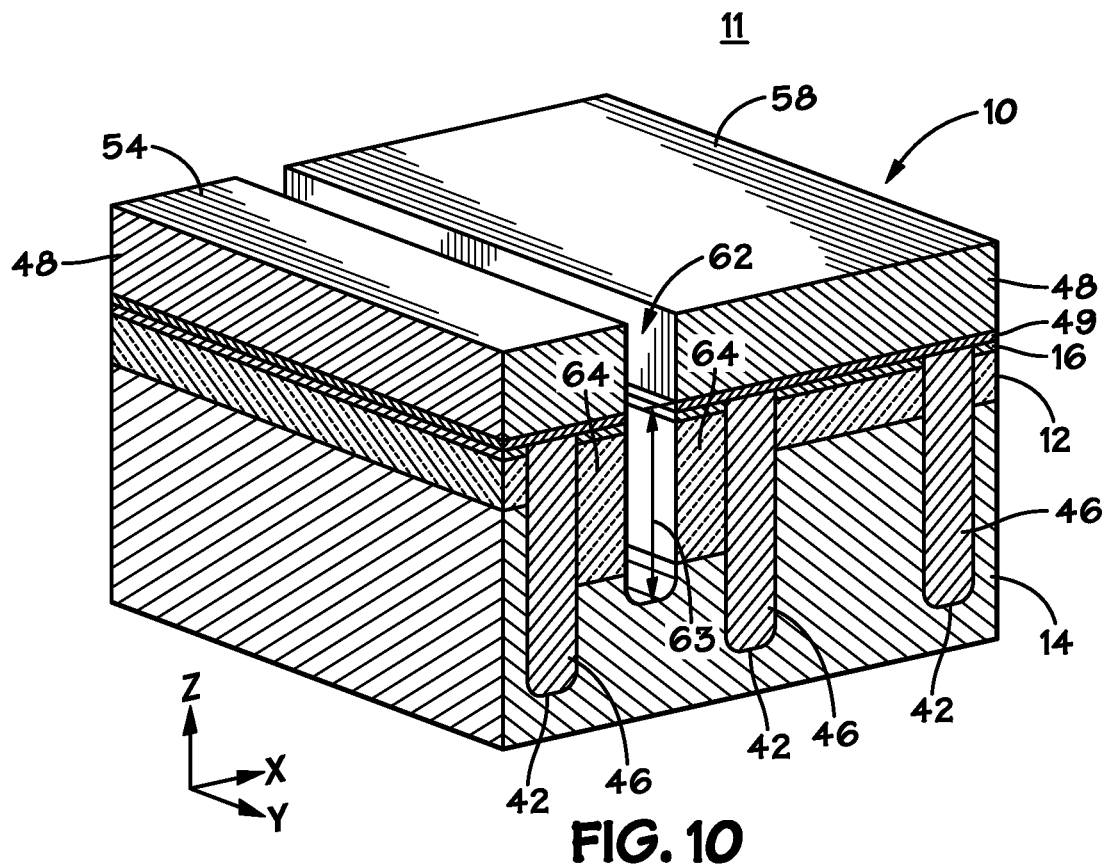

Next, the exposed regions 50 of the substrate 10 may be etched, such as be dry etch or wet etch, to form first shallow trenches 62, as illustrated by FIG. 10. The first shallow trenches 62 may be formed to a depth 63. The first shallow trenches 62 may be generally linear, generally parallel, generally extend generally laterally in the y-direction and generally downward in the z-direction, and thus, may be generally parallel to the deep isolation trenches 42. In this embodiment, the shallow trenches 62 are formed with a generally anisotropic dry etch and are deeper than the upper doped region 12, but not as deep as the deep isolation trenches 42. The shallow trenches 62 may have a generally rectangular or generally trapezoidal profile that is generally uniform in the y-direction over a substantial distance. Additionally, before, during, or after the formation of the first shallow trenches 62, the exposed regions 50 may be implanted with a dopant to form deep upper doped regions 64. As explained further below, the deep upper doped regions 64 may form the source and drain regions of a deep transistor formed by the first shallow trenches 62.

Figure 11:
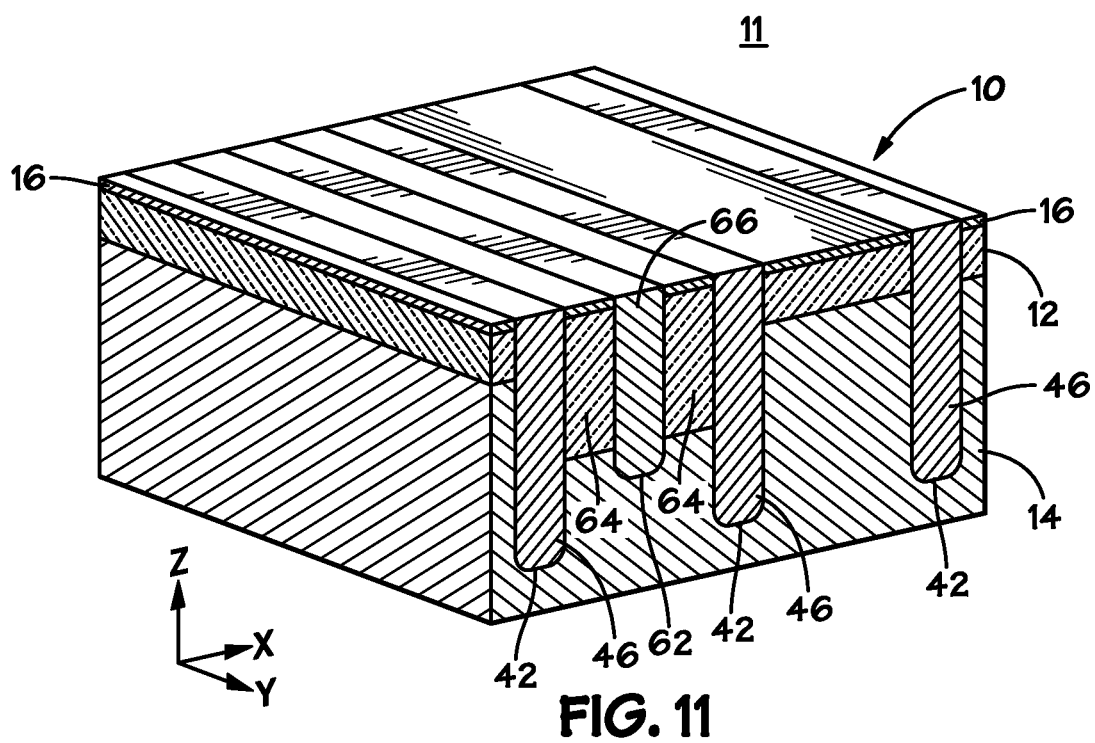

As illustrated in FIG. 11, the first shallow trenches 62 are filled with a dielectric 66, such as such as high density plasma (HDP) oxide, tetra-ethyl-ortho-silicate (TEOS), or spun-on-glass (SOG), and the substrate 10 is planarized to remove mask 48. In some embodiments, the shallow trenches 62 may be filled with a different material than the deep isolation trenches 42. In other embodiments, the dielectric 66 may be the same material used to fill the deep isolation trenches 42. As described below, the dielectric 66 formed in the trenches 62 provides for formation of a channel between a source and drain formed by the deep upper doped region 64.

Figure 12:
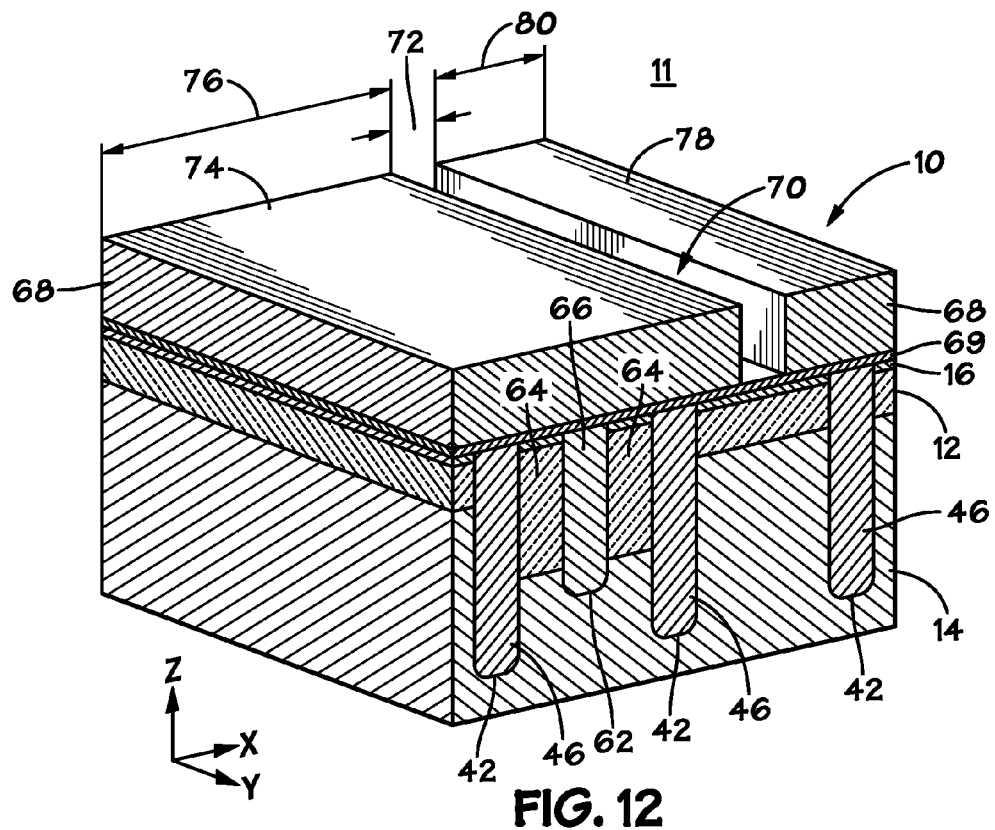
FIGS. 12-14 depict an embodiment of a process for forming second shallow trenches in the device of FIG. 1 in accordance with an embodiment of the present invention.

Next, as shown in FIG. 12, a second shallow trench mask 68 is formed on the substrate 10. In some embodiments, another stop body (e.g., a layer) 69 may also be formed on the pad oxide 16. The second shallow trench mask 68 may be photoresist or a hard mask, and it may be patterned with various lithographic systems, such as those discussed above. The illustrated shallow trench mask 68 includes exposed regions 70 that may have a width 72 generally equal to or less than ¼ F, ½ F or F, a first covered region 74 with a width 76, and a second covered region 78 with a width 80. The exposed regions 70 may be generally linear, generally parallel, and interposed generally equidistant between every other one of the deep isolation trenches 42. Thus, the exposed region 70, the first covered region 74, and the second covered region 78 may be patterned on the substrate 10 in the x-direction forming exposed regions 70 between every other pair of deep isolation trenches 42. In other embodiments, the second shallow trench mask 68 may be formed with spacers formed on sidewalls of the mask, similar to the techniques described above during formation of the column isolation trenches 42.

Figure 13:
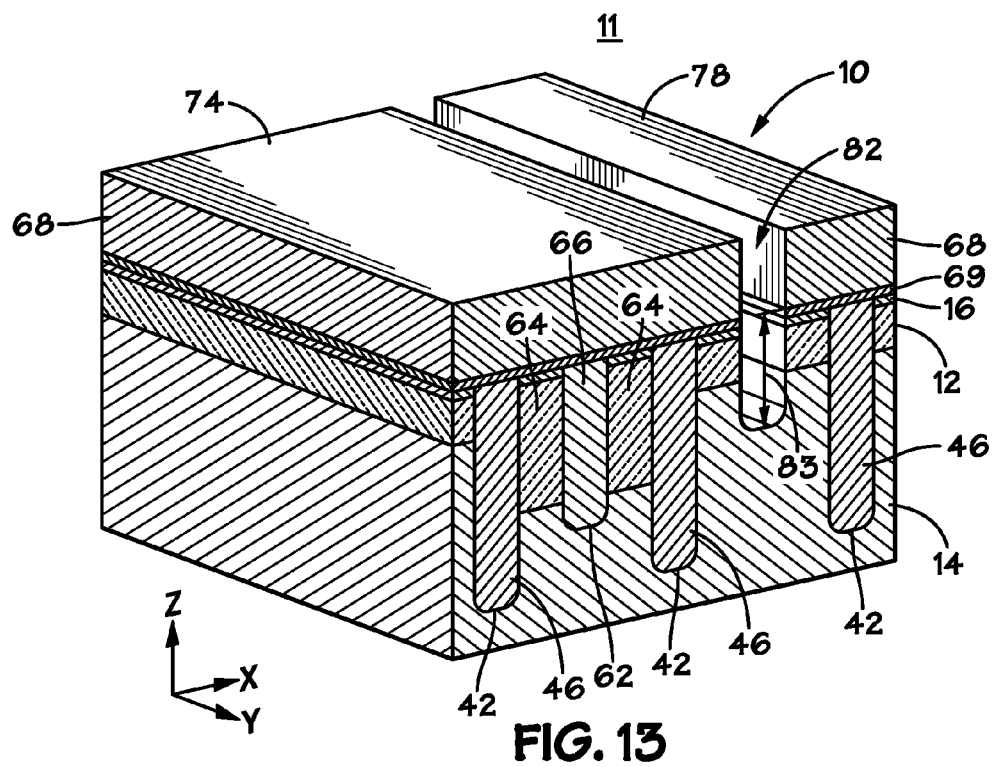

Next, the exposed regions 70 of the substrate 10 may be etched to form second shallow trenches 82, as illustrated by FIG. 13. The second shallow trenches 82 may be formed to a depth 83, wherein the depth 83 is less than the depth 63. The second shallow trenches 82 may be generally linear, generally parallel, extend generally laterally in the y-direction and generally downward in the z-direction, and thus, may be generally parallel to the deep isolation trenches 42. In this embodiment, the second shallow trenches 82 may be formed with a generally anisotropic dry etch and are deeper than the upper doped region 12, but not as deep as the deep upper doped region 64. The second shallow trenches 82 may have a generally rectangular or generally trapezoidal profile that is generally uniform in the y-direction over a substantial distance.

Figure 14:
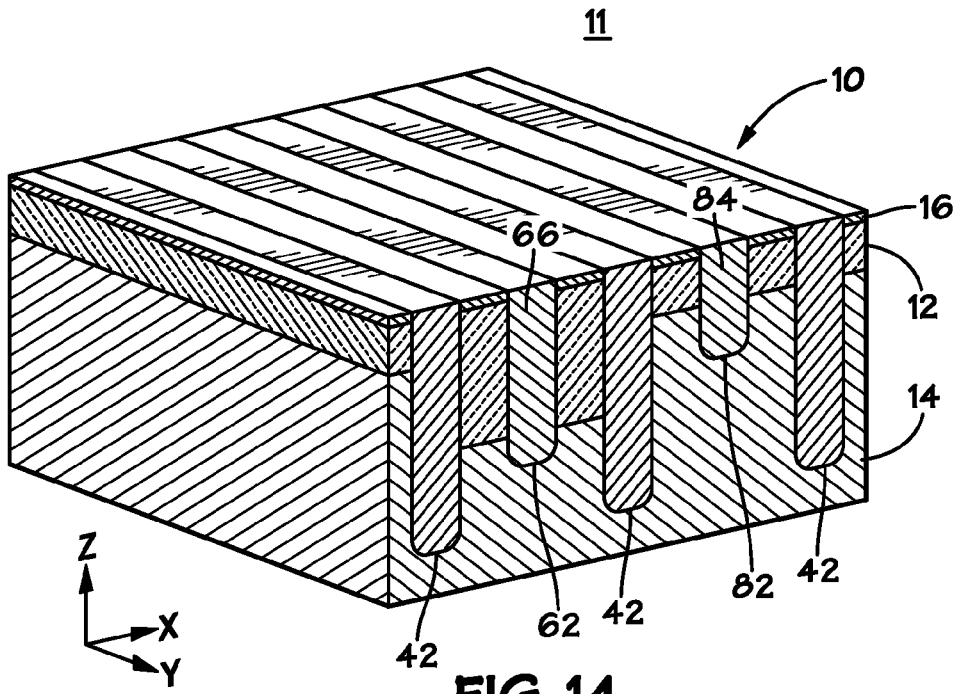

As illustrated in FIG. 14, the second shallow trenches 82 are filled with a dielectric 84 and the substrate 10 may be planarized to remove mask 68. In some embodiments, the second shallow trenches 82 may be filled with a different material than the deep isolation trenches 42 and/or the first shallow trenches 62. In other embodiments, the dielectric 84 may be the same material used to fill the deep isolation trenches 42 and/or the first shallow trenches 62. As described below, the dielectric 84 formed in the trenches 82 provides for formation of a channel between a source and drain formed by the upper doped region 12 on either side of the second shallow trenches 82.

Figure 15:
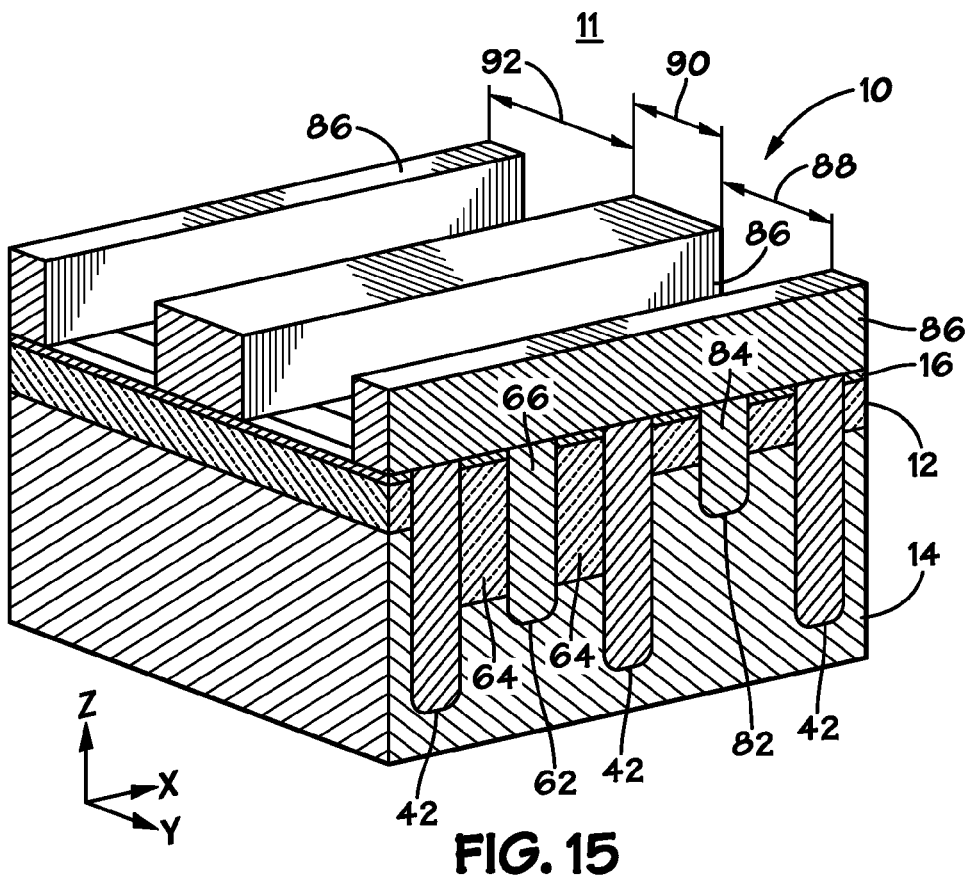
FIGS. 15 and 16 depict an embodiment of a process for forming row trenches in the device of FIG. 1 in accordance with an embodiment of the present invention.

Next, a row mask 86 may be formed, as illustrated by FIG. 15. In some embodiments, the row mask 86 may be generally perpendicular to the column mask 26 (FIG. 2). In other embodiments, the row mask 86 may be oriented differently with respect to the column mask 26. The row mask 86 may be formed with photoresist or it may be a hard mask, for example, and it may be patterned with photolithography or other lithographic processes, e.g., nano-imprint lithography or electron-beam lithography. For example, the row mask 86 may be formed by patterning a body of amorphous carbon that is formed on the substrate 10. The amorphous carbon may be formed with a thickness less than about 3000 Å, e.g., a thickness less than or equal to about 2000 Å. The row mask 86 may define masked regions having a width 90 and exposed regions having a width 88. In some embodiments, the row mask 86 may be formed with a sub-photolithographic process, e.g., a sidewall-spacer process, a resist-reflow process, or a line-width thinning process. The widths 88 or 90 may be generally equal to or less than F, ¾ F, or ½ F. The row mask 86 may define a repeating pattern of lines with a pitch 92, or in some embodiments, the pattern may be interrupted by other structures. The masked regions of the row mask 86 may be generally straight, generally parallel to one another, and may generally extend in the x-direction. In other embodiments, the masked regions of the row mask 86 may undulate side to side or up and down, or they may be segmented.

Figure 16:
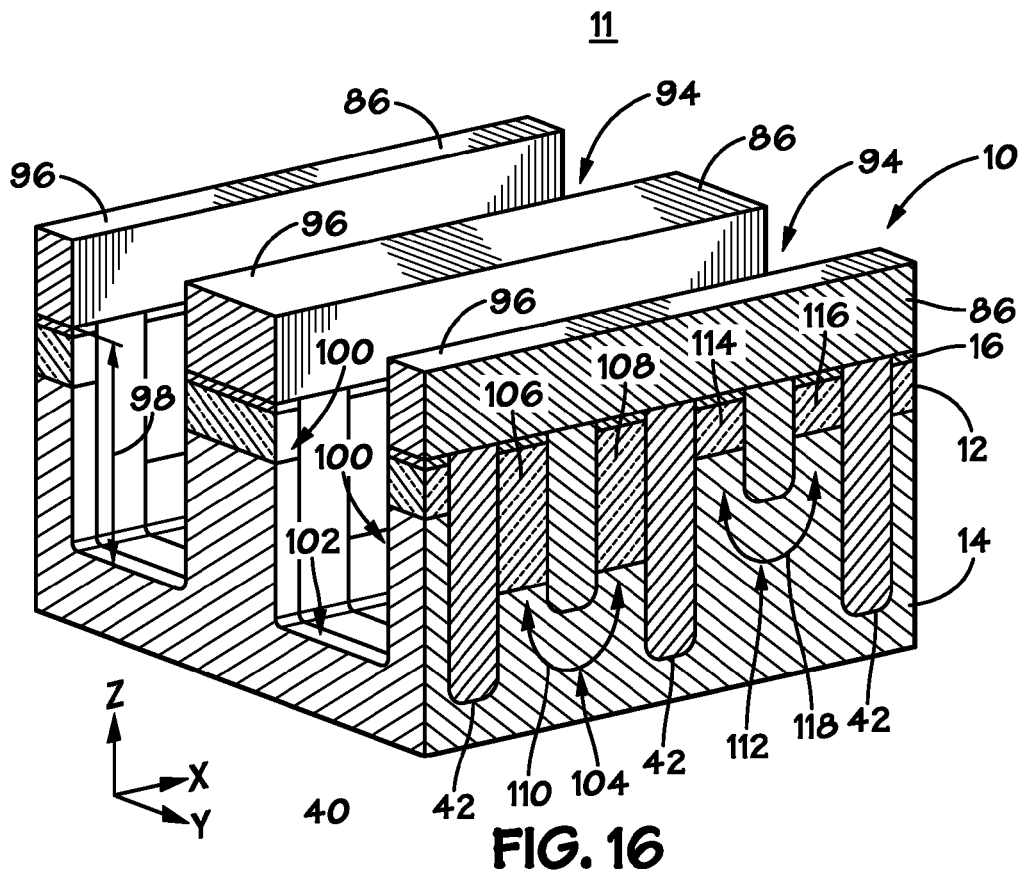

Next, row trenches 94 may be formed, as illustrated by FIG. 16. The row trenches 94 may define fins 96 disposed under the masked region of the row mask 86. The row trenches 94 may be formed with a dry etch that etches the upper doped region 12, the lower doped region 14, the dielectric 46, and the dielectric 66 at generally the same rate. The row trenches 94 may have a depth 98 that is greater than the depth of the first shallow trenches 62 (FIG. 10) and less than a depth of the deep isolation trenches 42 (FIG. 5). The fins 96 may be generally defined by sidewalls 100 and bottom surfaces 102 of the trenches 94. In one embodiment, the width 90 of the fins 96 may be about 30 nanometers, about 20 nanometers, or less, and the width 88 of the row trench 94 may be about 40 nanometers, about 30 nanometers, or less.

As explained further below, each fin 96 may include a lower transistor 104 formed by a source 106 and drain 108 of the deep upper doped region 64 and conductive channel 110 formed by the first shallow trenches 62. Additionally, each also includes an upper transistor 112 formed by a source 114 and drain 116 of the upper doped region 12 and a conductive channel 118 formed by the second shallow trenches 82. The upper transistor 112 is thus vertically offset from the lower transistor 104 relative to the bottom surfaces 102. As explained further below, the lower transistors 104 of a fin 96 may be separately activated from the upper transistors 112 by biasing upper and lower gates, the formation of which is described below in FIGS. 17-22.

Figure 17:
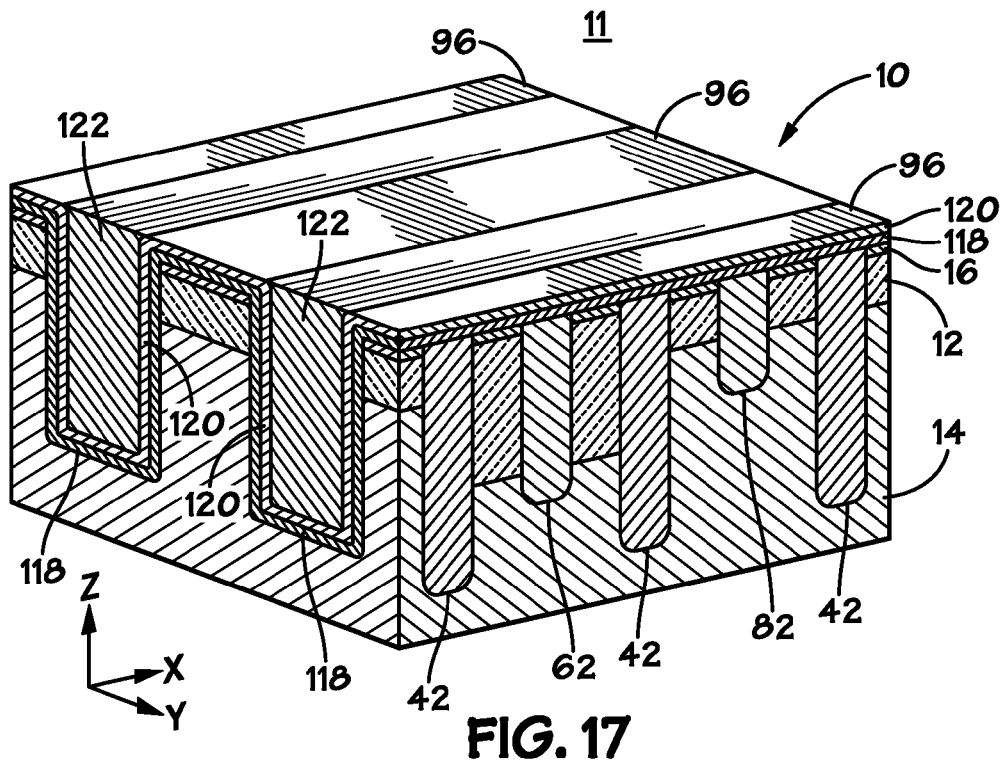
FIGS. 17 and 18 depict an embodiment of a process for forming lower gates in the device of FIG. 1 in accordance with an embodiment of the present invention.
Figure 18:
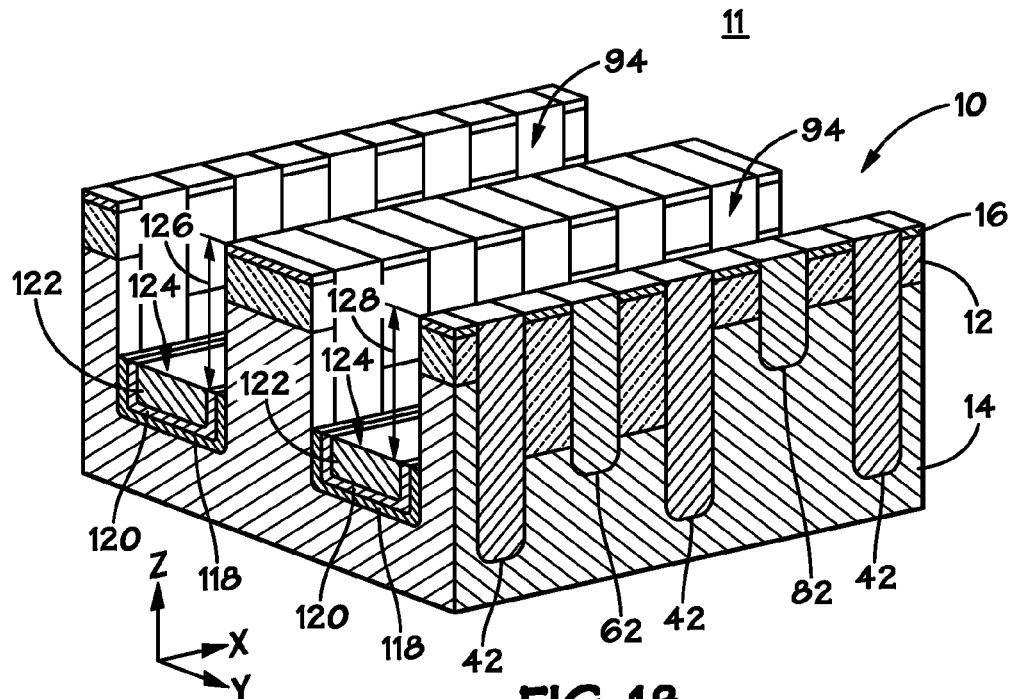

FIGS. 17 and 18 depict formation of lower gates in the trenches 94 and adjacent to each of the sidewalls 100. It should be appreciated that, as used herein, the term "lower" refers to the location of the gate relative to the trenches 94, such that lower gates are nearer to the bottom surface of the trenches 94. Thus, the lower gates are relatively closer to the bottom surface 102 and farther from the upper portion of the fins 96 than subsequently formed upper gates.

As shown in FIG. 17, a gate oxide 118 may be formed on the sidewalls 100 of the fins 96 and bottom portion 102 of the trenches 94. The gate oxide 118 may be deposited, grown, or otherwise formed, and it may substantially or entirely cover the exposed portions of the upper doped region 12 and the lower doped region 14. The gate oxide 118 may include a variety of dielectric materials, such as oxide (e.g., silicon dioxide), oxynitride, or high-dielectric constant materials like hafnium dioxide, zirconium dioxide, and titanium dioxide. The gate oxide 118 may have a thickness less than about 60 Å, e.g., a thickness equal to or less than about 40 Å.

Next, a liner 120 may be formed on the gate oxide 118 in accordance with an embodiment of the present invention. As shown in FIG. 17, the liner 120 may be formed on the bottom surface 102 of the row trenches 96 and on the sidewalls 100 of the fins 96. The liner 120 may include titanium nitride (TiN), tungsten nitride, or other appropriate conductive materials or combination thereof.

Further, as shown in FIG. 17, a metal conductor 122 may be formed on the substrate 10 in accordance with an embodiment of the present invention. The metal conductor 122 may fill the row trenches 94 and along the sidewalls 100 of the fins 96. The metal conductor 122 is deposited on top of the liner 120. As will be appreciated, only that portion of the metal conductor 122 in the trenches 94 is illustrated. The metal conductor 122 may include tungsten, ruthenium (Ru), or other appropriate conductive materials or combination thereof. For example, in one embodiment, titanium nitride liner 120 may be disposed on the gate oxide 118, and tungsten may be disposed on the titanium nitride liner 120 to form the metal conductor 122. As discussed further below, etching of the metal conductor 122 may form bottom gates (e.g., wordlines) in the row trenches 94 on either the sidewalls 100 of the fins 96.

FIG. 18 depicts the substrate 10 after a removal of a portion of the metal conductor 122, the liner 120, and the gate oxide 118 to form a lower gate 124 in accordance with an embodiment of the present invention. As shown in FIG. 18, the liner 120 and gate oxide 118 may be removed along the sidewalls 100 of the fins 96 to a depth 126. The metal conductor 122 may be removed to a depth 128 in the trenches 94. The metal conductor 122, the liner 120, and the gate oxide 118 may be removed by one of or a combination of etch processes, such as wet etch, dry etch, or other suitable processes. The duration of the etch may control the depth (e.g., distance) of the etch into the row trenches 96. Additionally, in some embodiments, differing etch rates of the different materials may result in different depths 126 and 128. For example, as shown in FIG. 18, after etching, the metal conductor 122 may protrude slightly above the gate oxide 118 and the liner 120, such that the depth 126 is less than the depth 128. In other embodiments, the depth 126 may be equal to or greater than the depth 128.

FIGS. 19-22 depict the formation of upper gates (e.g., access lines such as wordlines) in the trenches 94 and above the lower gates 124. As used herein, the term "upper" refers to the location of the gate relative to the trenches 94, such that the "upper" gates are closer to the upper portion of the fins 96 and farther from the bottom surface 102 than the previously formed lower gates 124. As shown in FIGS. 19-22, the upper gates may be formed in the portions of the trenches 94 that remain after formation of the lower gates.

Figure 19:
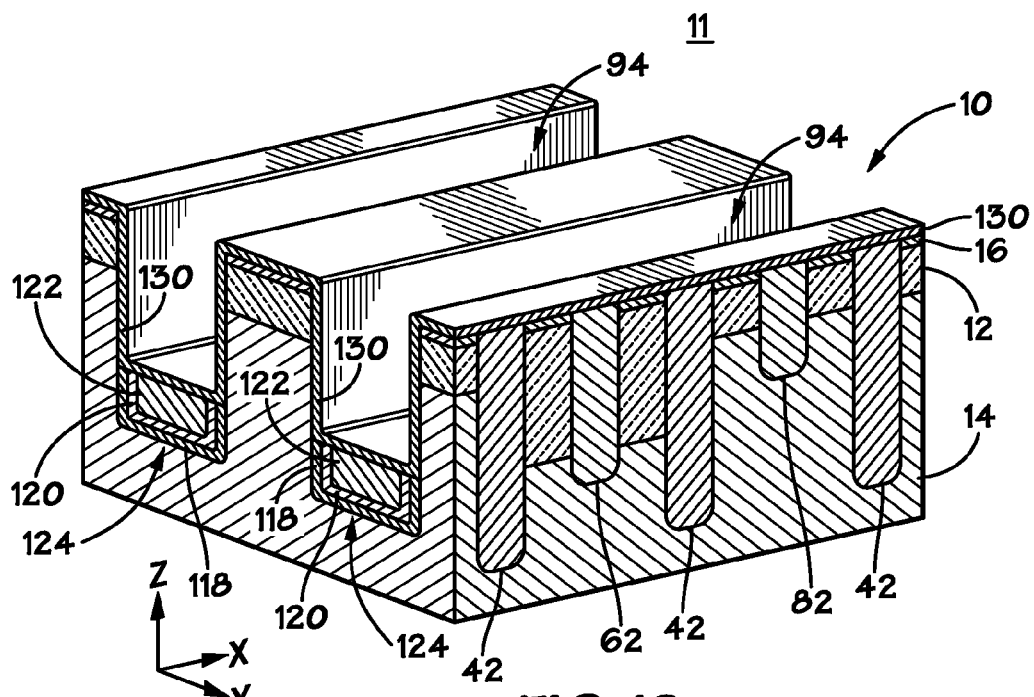
FIGS. 19-22 depict an embodiment of a process for forming lower gates in the device of FIG. 1 in accordance with an embodiment of the present invention.

FIG. 19 depicts formation of a gate oxide 130 one sidewalls 100 of the fins 96 and on the lower gates 124, such as on the metal conductor 122, the liner 120, and the gate oxide 118. The gate oxide 130 may be deposited, grown, or otherwise formed, and it may substantially or entirely cover the exposed portions of the upper doped region 12 and some of the lower doped region 14. The gate oxide 130 may include a variety of dielectric materials, such as oxide (e.g., silicon dioxide), oxynitride, or high-dielectric constant materials like hafnium dioxide, zirconium dioxide, and titanium dioxide. The gate oxide 130 may have a thickness less than about 60 Å, e.g., a thickness equal to or less than about 40 Å.

Figure 20:
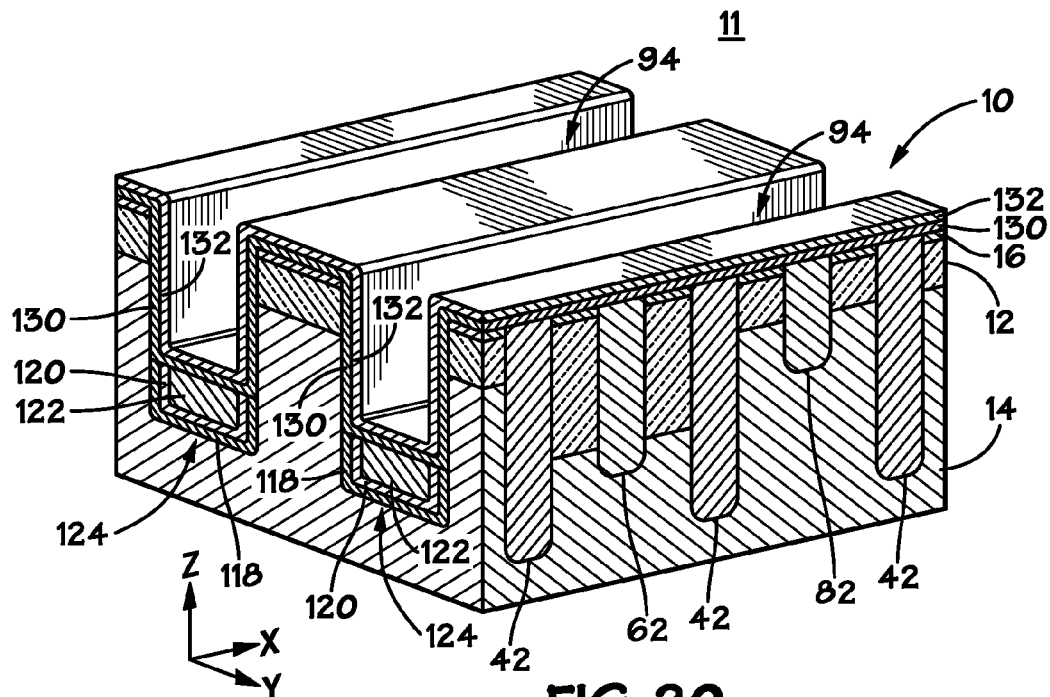

Next, in FIG. 20, a liner 132 may be formed on the gate oxide 130 in accordance with an embodiment of the present invention. As shown in FIG. 20, the liner 132 may be formed on the oxide 130 and on the lower gates 124 and the sidewalls 100 of the fins 96. The liner 132 may include titanium nitride (TiN), tungsten nitride, or other appropriate conductive materials or combination thereof.

Figure 21:
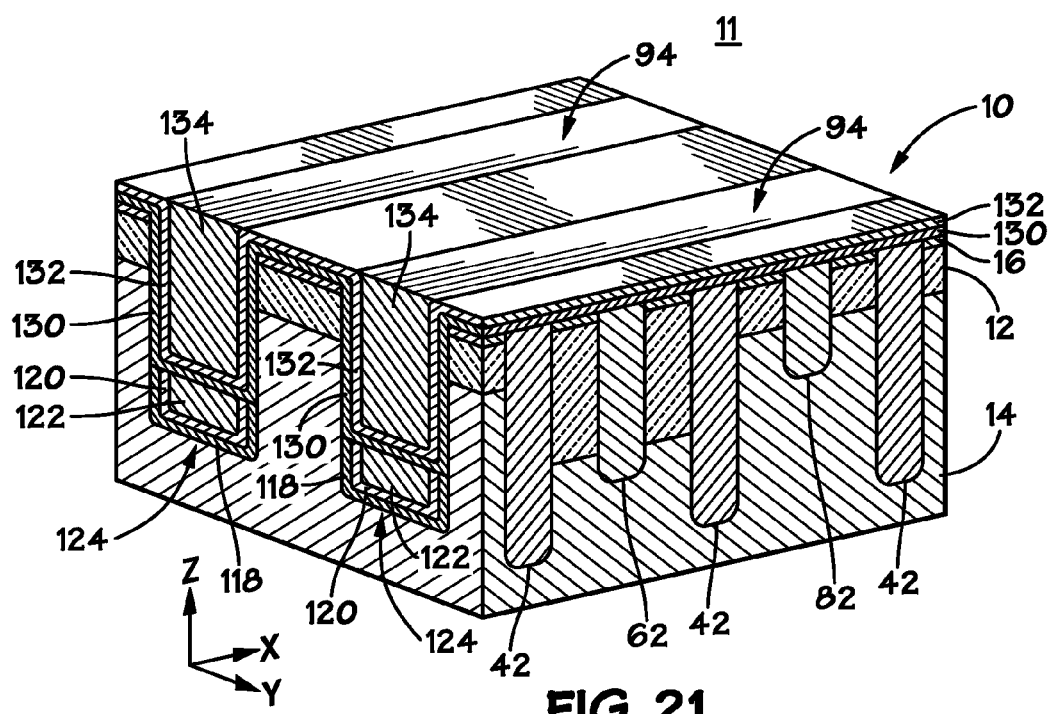

As shown in FIG. 21, a metal conductor 134 may be formed on the substrate 10 in accordance with an embodiment of the present invention. The metal conductor 134 may be formed in the row trenches 94 and on the liner 132. As will be appreciated, only that portion of the metal conductor 134 formed in the trenches 94 is illustrated. The metal conductor 134 may include tungsten, ruthenium (Ru), or other appropriate conductive materials or combination thereof. For example, in one embodiment, titanium nitride liner 132 may be disposed on the gate oxide 130, and tungsten may be disposed on the titanium nitride liner 132 to form the metal conductor 134. As discussed further below, etching of the metal conductor 134 may form upper gates (e.g., access lines such as wordlines) in the row trenches 94 on the sidewalls 100 of the fins 96 and above the lower gates 124.

Figure 22:
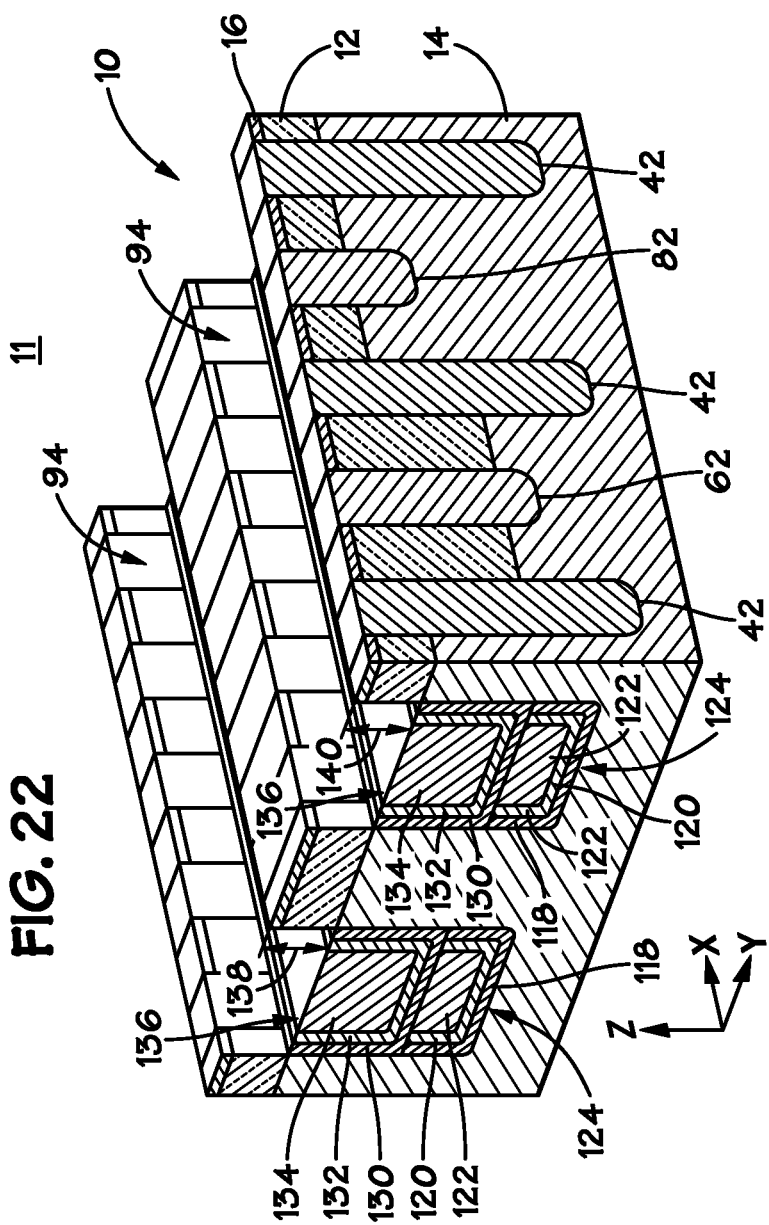

FIG. 22 depicts the substrate 10 after a removal of a portion of the metal conductor 134, the liner 132, and the gate oxide 130 to form upper gates 136 in accordance with an embodiment of the present invention. As shown in FIG. 22, the liner 132 and gate oxide 130 may be removed along the sidewalls 100 of the fins 96 to a depth 138. The metal conductor 134 may be removed to a depth 140 in the portion 96. As noted above, the metal conductor 134, the liner 132, and the gate oxide 130 may be removed by one or a combination of etch processes, such as wet etch, dry etch, or other suitable processes. The duration of the etch may control the depth (e.g., distance) of the etch into portion 96. In some embodiments, the depths 138 and 140 may be substantially equal, as shown in FIG. 22. In other embodiments, differing etch rates of the different materials may result in different depths 138 and 140. The metal conductor 134 and liner 132 may from upper gates 136 for accessing the upper transistors 112 of the fins. As described further below, upper gates 136 and lower gates 124 may be used to activate transistors 112 and 104 respectively. Such a device may be referred to as a "cross-hair cell" as each access line (e.g., gates 136 and 124) connects (i.e., forms a cross-point or cross-hair) with an access device (e.g., the transistors 104 and 112 respectively of fins 96).

Figure 23:
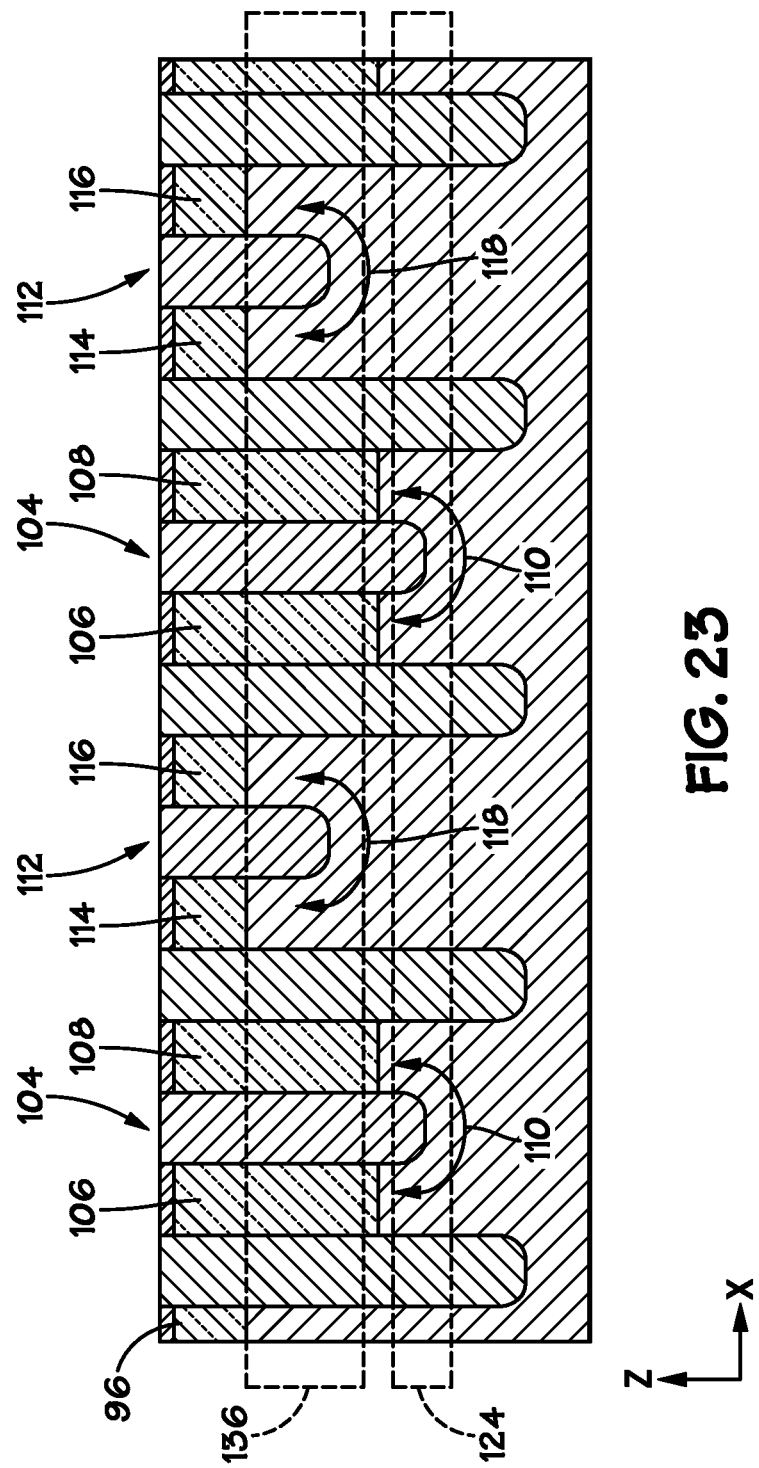
FIG. 23 is a side view of a fin having transistors and gates formed using the techniques of FIGS. 1-22.

FIG. 23 is a side view of a fin 96 constructed in accordance with the techniques described above in FIGS. 1-22. As described above, an upper gate 136 and a lower gate 124 may be constructed on and extending parallel to a sidewall of the fin 96 in accordance with FIGS. 15-22. As noted above, the fin 96 includes vertically offset transistors 104 and 112 constructed along the fin 96 in the x-direction. The lower transistors 104 may include the source 106 and drain 108 formed in the deep upper doped region 64 and separated by the first shallow trenches 62. As described below in FIG. 26, biasing of the lower gate 124 may activate the channel 110 of the transistors 104 and provide for operation of the lower transistors 104. As noted above, each of the upper transistors include a source 114 and drain 116 formed in the upper doped region 12 and separated by the shallow trench 82. The upper transistors 112 are vertically offset from the lower transistors 104 and may be operated by the upper gate 136 to activate the channels 118, as described below in FIG. 25.

Figure 24:
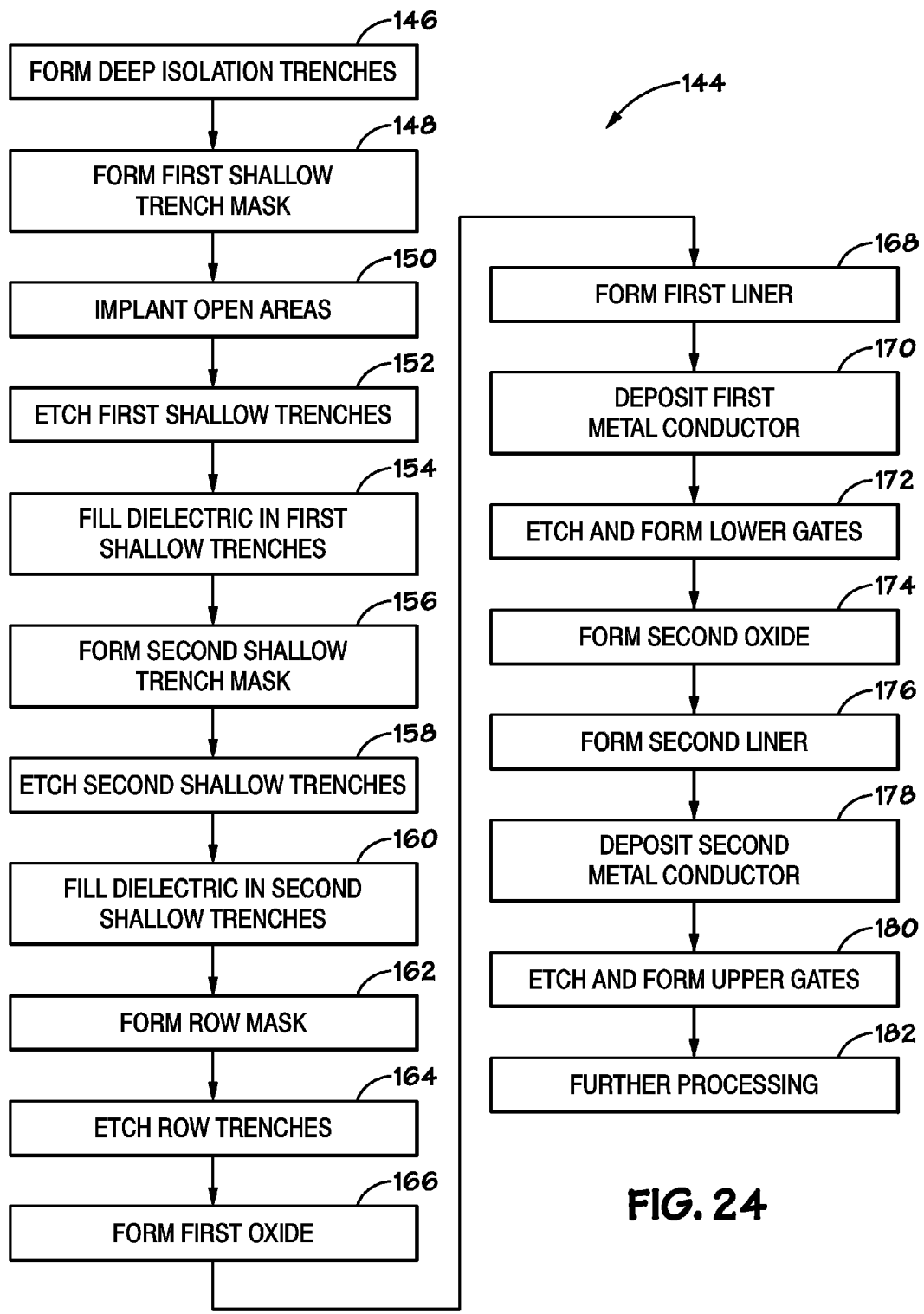
FIG. 24 is flowchart depicting the manufacturing process of FIGS. 1-22 in accordance with an embodiment of the present invention.

FIG. 24 is a flowchart summarizing a process 144 described above in FIGS. 1-22. As described above, deep isolation trenches may be formed in the substrate 10 (block 146), as shown above in FIGS. 1-8. Next, the first shallow trench mask may be patterned on the substrate 10 (block 148), as shown above in FIG. 9. The open areas defined by the mask may be implanted via a suitable dopant (block 150), and the open areas may be etched to form deep shallow trenches (block 152), as shown above in FIG. 10. As noted above, the implantation may be performed before, during, or after the etch of the deep shallow trenches. Next, a dielectric may be deposited in the deep shallow trenches (block 154), as shown in FIG. 11, and the substrate may be planarized in preparation for subsequent steps. The second shallow trench mask may be formed on the substrate 10 (block 156), as shown in FIG. 12, and the shallow trenches may be etched (block 158) as shown in FIG. 13. As shown in FIG. 14, a second dielectric may be deposited in the shallow trenches (block 160) and the substrate 10 may be planarized.

A row mask may be patterned on the substrate (block 162), as shown in FIG. 15, and row trenches may be etched into the substrate to form row trenches and fins (block 164), as shown in FIG. 16. An oxide may be formed in the row trenches on the sidewalls and bottom surface of the row trenches (block 166), as described in FIG. 17. A liner may be formed on the oxide (block 168) and a metal conductor may be deposited in the row trenches (block 170), as also shown in FIG. 17. Finally, as depicted in FIG. 18, the metal conductor may be etched to a desired depth to form the lower gates (block 172).

After formation of the lower gates (block 172), another oxide may be formed in the row trenches on the sidewalls of the fins and on the lower gates (block 174), as shown in FIG. 19. A second liner may be formed on the second oxide (block 176), and a second metal conductor may be deposited in the row trenches and on the second liner (block 178), as shown in FIGS. 20 and 21. As depicted in FIG. 22, the second metal conductor may be etched to a desired depth to form the upper gates (block 180). As will be appreciated by those of ordinary skill in the art, after formation of the upper gates (block 180), digitlines and storage devices accessible by the transistors of the fins 96 may be formed on the array (block 182).

Figure 25:
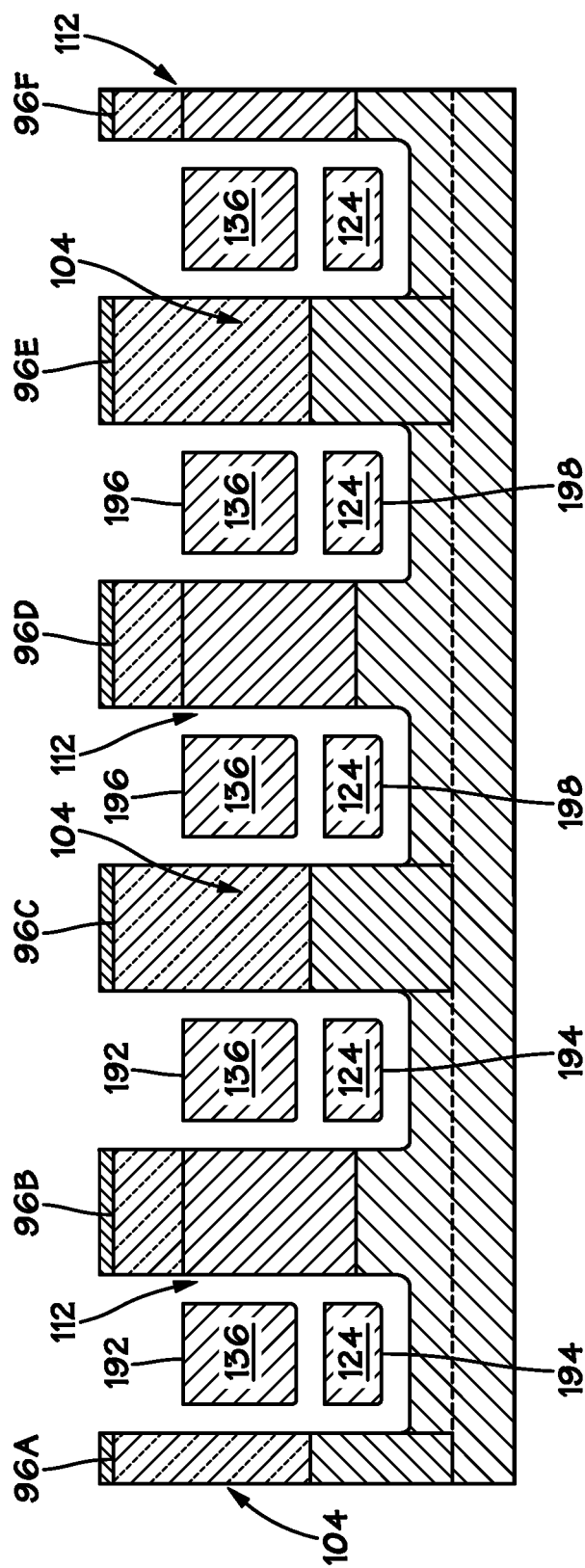
FIGS. 25 and 26 depict operation of an array portion having upper gates, lower gates, and vertically offset transistors in accordance with an embodiment of the present invention.
Figure 26:
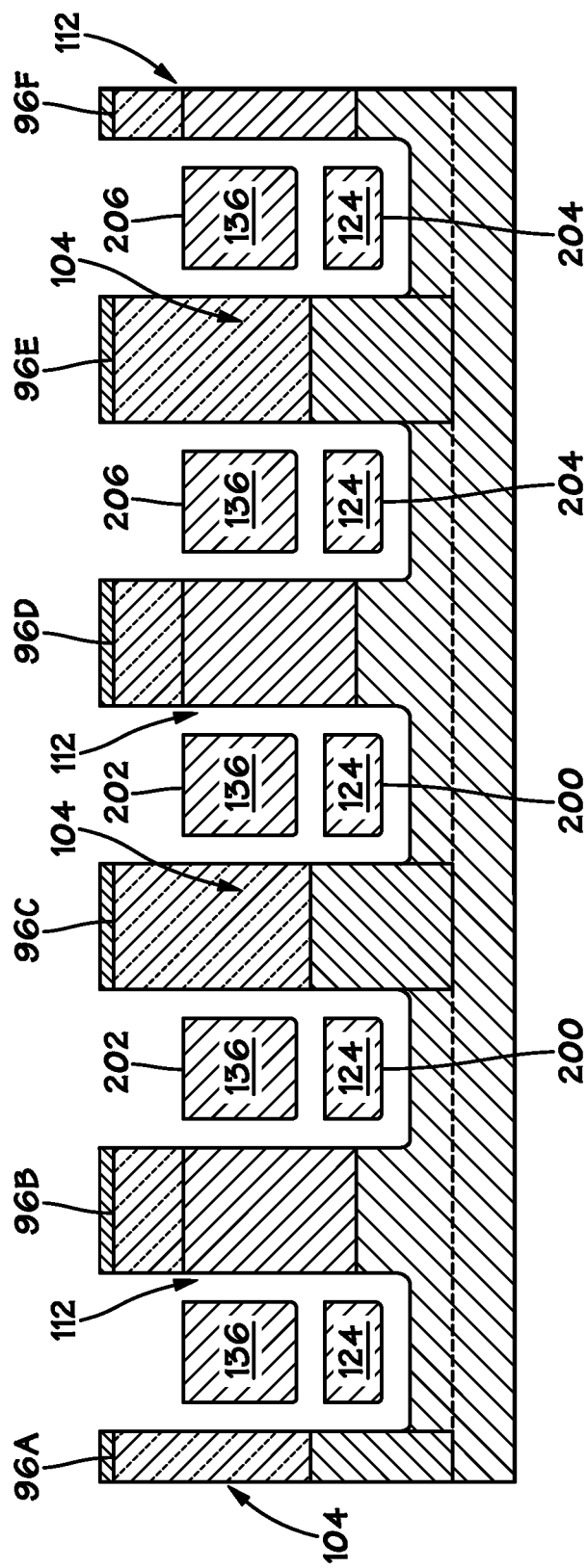

FIGS. 25 and 26 are schematic cross-sections of an array portion 190 formed in the manner described above in FIGS. 1-22 and depicting operation of upper gates 136 and lower gates 124 to operate the transistors of fins 96. FIGS. 25 and 26 depict fins 96A-96F separated by row trenches 94 and each having upper gates 136 and lower gates 124 disposed therebetween and constructed according to the techniques described above. For clarity, each fin 96A, 96C, and 96E depicts the lower transistors 104 and each of fins 96B, 96D, and 96F depict the upper transistors 112. As will be appreciated, the lower transistors 104 and the upper transistors 112 may each be coupled to and used as access for devices for storage device disposed on the transistors 104 and 112. For example, upper transistors 112 may be access devices for first storage devices and lower transistors 104 may be access devices for second storage devices.

FIG. 25 depicts operation of the upper transistors 112 of fins 96B and 96D in accordance with an embodiment of the present invention. To operate the upper transistors 112 of fin 96B, the upper gate 192 may be biased to a sufficient voltage to create current paths 118 and activate the upper transistors 112. During such operation, the lower gate 194 is not actively biased to minimize or prevent current conduction to the lower gate 194. Similarly, to operate the upper transistors 112 of fin 96D, the upper gate 196 may be biased to a sufficient voltage to create current paths 118 and activate upper transistors 112. Again, during such operation, the lower gate 198 is not actively biased to minimize or prevent current conduction to the lower gate 198. It should be appreciated that the upper transistors of fins 96A, 96C, and 96E may be activated by biasing the upper gates on the sidewalls of each respective fin.

FIG. 26 depicts operation of the lower transistors 104 of fins 96C and 96E in accordance with an embodiment of the present invention. To operate the lower transistors 104 of fin 96C, a lower gate 200 may be biased to a sufficient voltage to create current paths 110 and activate the lower transistors 112. During this operation, the upper gates 202 are not actively biased to minimize or prevent undesirable current conduction. The lower gate 196 may use the deep upper doped region 64 to bypass the inactive upper gates and conduct current to the lower gate 196. Similarly, to operate the lower transistors 104 of fin 96E, a lower gate 204 may be biased to a sufficient voltage to create current paths 110 along the fin 96E and activate the lower transistors 112. During this operation, the upper gate 204 of fin 96E is not actively biased to minimize or avoid undesirable current conduction. The deep upper doped region 64 of fin 96E enables current to bypass the inactive upper gate 204 and conduct current to the lower gate 196.

What is claimed is:

1. A method, comprising:
   forming a first trench in a substrate to a first depth;
   forming a second trench in the substrate to a second depth;
   forming a third trench between the first trench and the second trench in the substrate to a third depth, wherein the third depth is greater than the second, and wherein the second depth is greater than the first depth;
   forming doped regions in the substrate on each side of the first trench and on each side of the second trench;
   forming a fourth trench comprising an upper gate and a lower gate, wherein the upper gate is disposed above the lower gate, and wherein the upper gate forms a conductive channel between the doped regions on each side of the first trench when biased and the lower gate forms a conductive channel between the doped regions on each side of the second trench when biased.

2. The method of claim 1, comprising forming a liner and a gate oxide to insulate the lower gate from the upper gate and the substrate.

3. The method of claim 1, comprising forming a liner and a gate oxide to insulate the upper gate from the lower gate and the substrate.

4. The method of claim 1, comprising filling the first trench, the second trench, and the third trench with a dielectric material.

5. The method of claim 1, comprising forming digit lines that electrically couple to transistors formed by the upper gate and doped regions on each side of the first trench and to transistors formed by the lower gate and doped regions on each side of the second trench.

6. The method of claim 1, comprising forming storage devices that electrically couple to transistors formed by the upper gate and doped regions on each side of the first trench and to transistors formed by the lower gate and doped regions on each side of the second trench.

7. The method of claim 1, wherein forming the doped regions on each side of the first trench and on each side of the second trench comprises forming the doped regions on each side of the second trench substantially deeper than the doped regions on each side of the first trench.

8. A semiconductor device, comprising:
   a first semiconductor fin comprising a first plurality of transistors and a second plurality of transistors, wherein the first plurality of transistors are disposed vertically above the second plurality of transistors;
   a lower gate disposed on either side of the first semiconductor fin, wherein the lower gate activates the second plurality of transistors when biased; and
   an upper gate disposed on either side of the first semiconductor fin above the lower gate, wherein the upper gate activates the first plurality of transistors when biased.

9. The semiconductor device of claim 8, comprising a second semiconductor fin adjacent to the first semiconductor fin.

10. The semiconductor device of claim 8, comprising a trench formed by a sidewall of the first semiconductor fin and a sidewall of the second semiconductor fin.

11. The semiconductor device of claim 10, wherein the lower gate and the upper gate are disposed in the trench.

12. The semiconductor device of claim 8, wherein each of the first plurality of transistors comprises a source and a drain formed in a first doped region of the first semiconductor fin.

13. The semiconductor device of claim 12, wherein each of the second plurality of transistors comprises a source and a drain formed in a second doped region of the first semiconductor fin, wherein the second doped region is substantially deeper than the first doped region.

14. The semiconductor device of claim 8, wherein the lower gate forms a current path that bypasses the upper gate when the lower gate is biased.

15. A semiconductor device, comprising:
a plurality of semiconductor fins each comprising a first plurality of transistors and a second plurality of transistors, wherein the first plurality of transistors is disposed vertically above the second plurality of transistors;
a plurality of trenches formed between adjacent semiconductor fins of the plurality of semiconductor fins, each comprising a first conductor and a second conductor; and
wherein the first conductor is configured to activate the corresponding first plurality of transistors and the second conductor is configured to activate the corresponding second plurality of transistors.

16. The semiconductor device of claim 15, wherein each of the first plurality of transistors and each of the second plurality of transistors is electrically coupled to digit lines.

17. The semiconductor device of claim 15, wherein each of the first plurality of transistors and each of the second plurality of transistors is electrically coupled to storage devices.

18. The semiconductor device of claim 15, wherein each of the plurality of semiconductor fins comprises deep isolation trenches between each of the first plurality of transistors and each of the second plurality of transistors.

19. The semiconductor device of claim 15, wherein each of the first plurality of transistors comprises a first trench.

20. The semiconductor device of claim 19, wherein each of the second plurality of transistors comprises a second trench, wherein a depth of the second trench is greater than a depth of the first trench.

21. A method, comprising:
forming a first plurality of trenches having a first depth in a substrate, wherein each trench of the first plurality of trenches is generally parallel to the other trenches of the first plurality of trenches;
forming a second plurality of trenches having a second depth in a substrate, wherein each trench of the second plurality of trenches is generally parallel to the other trenches of the second plurality of trenches and the first plurality of trenches, wherein the second depth is greater than the first depth, and wherein each trench of the second plurality of trenches is formed between two trenches of the first plurality of trenches;
forming a third plurality of trenches having a third depth in a substrate, wherein each trench of the third plurality of trenches is generally parallel to the other trenches of the third plurality of trenches, the second plurality of trenches, and the first plurality of trenches, wherein the third depth is greater than the first depth and the second depth, and wherein each trench of the third plurality of trenches is formed between a trench of the first plurality of trenches and a trench of the second plurality of trenches;
forming a first plurality of transistors, each comprising a trench of the first plurality of trenches;
forming a second plurality of transistors, each comprising a trench of the second plurality of trenches;
forming a fourth plurality of trenches, wherein each trench of the fourth plurality of trenches is generally parallel to the other trenches of the fourth plurality of trenches and generally perpendicular to the third plurality of trenches, the second plurality of trenches, and the first plurality of trenches, and wherein the fourth plurality of trenches define semiconductor fins comprising the first plurality of transistors and the second plurality of transistors.

22. A semiconductor device, comprising:
a semiconductor substrate comprising a fin formed therein;
a lower gate formed on a side wall of the fin; and
an upper gate formed above and generally parallel to the lower gate on the side wall of the fin.

23. The semiconductor device of claim 22, wherein the fin has a length greater than the width and the depth of the fin.

24. The semiconductor device of claim 22, wherein the substrate comprises an upper doped region and a lower doped region.

25. The semiconductor device of claim 24, wherein the upper doped region is doped differently than the lower doped region.

26. The semiconductor device of claim 22, wherein a distance between the fin and an adjacent fin may be generally equal to or less than F.

27. The semiconductor device of claim 22, wherein a distance between the fin and an adjacent fin may be generally equal to or less than ¾ F.

28. The semiconductor device of claim 22, wherein a distance between the fin and an adjacent fin may be generally equal to or less than ½ F.

* * * * *